(12) United States Patent
Kandori

(10) Patent No.: US 9,618,404 B2
(45) Date of Patent: Apr. 11, 2017

(54) TRANSDUCER AND MEASUREMENT APPARATUS

(71) Applicant: CANON KABUSHIKI KAISHA, Tokyo (JP)

(72) Inventor: Atsushi Kandori, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 117 days.

(21) Appl. No.: 14/736,075

(22) Filed: Jun. 10, 2015

(65) Prior Publication Data
US 2015/0365017 A1    Dec. 17, 2015

(30) Foreign Application Priority Data

Jun. 12, 2014 (JP) .................................. 2014-121568

(51) Int. Cl.
| | | |
|---|---|---|
| *H02N 1/08* | (2006.01) | |
| *G01H 11/06* | (2006.01) | |
| *G01L 1/14* | (2006.01) | |
| *H01L 21/78* | (2006.01) | |
| *H05K 3/32* | (2006.01) | |
| *B06B 1/02* | (2006.01) | |
| *H05K 1/14* | (2006.01) | |

(52) U.S. Cl.
CPC ............ *G01L 1/142* (2013.01); *B06B 1/0292* (2013.01); *H05K 1/147* (2013.01); *G01H 11/06* (2013.01); *H05K 2201/10083* (2013.01); *Y10T 29/49137* (2015.01)

(58) Field of Classification Search
CPC ................... G01L 1/142; H05K 1/147; H05K 2201/10083; G01H 11/06; Y10T 29/49137; B06B 1/0292
See application file for complete search history.

(56) References Cited

U.S. PATENT DOCUMENTS

| | | | | |
|---|---|---|---|---|
| 7,846,102 B2* | 12/2010 | Kupnik | ................. | B06B 1/0292 310/300 |
| 8,654,614 B2* | 2/2014 | Kandori | ............... | H04R 19/005 310/309 |
| 8,928,203 B2* | 1/2015 | Kandori | ................. | H02N 1/006 310/309 |
| 2009/0122651 A1* | 5/2009 | Kupnik | ................. | B06B 1/0292 367/181 |
| 2012/0086307 A1* | 4/2012 | Kandori | ................. | H02N 1/006 310/300 |

(Continued)

OTHER PUBLICATIONS

Ergun et al."Capacitive Micromachined Ultrasonic Transducers: Fabrication Technology";IEEE Transactions on Ultrasonics, Ferroelectrics, and Frequency Control, vol. 52, No. 12, Dec. 2005.

*Primary Examiner* — Daniel Pihulic
(74) *Attorney, Agent, or Firm* — Canon U.S.A. Inc., IP Division

(57) ABSTRACT

A transducer includes an element disposed on a substrate, where the element includes an electrode, and a connection electrode electrically connected to the electrode of the element. A conductive portion disposed on an insulating film of a flexible print circuit board is electrically connected to the connection electrode. Part of the conductive portion is exposed so as to face a surface of the substrate having the element disposed thereon. An insulation layer is disposed on part of the surface of the substrate facing the flexible print circuit board.

18 Claims, 23 Drawing Sheets

(56) References Cited

U.S. PATENT DOCUMENTS

2015/0091477 A1* 4/2015 Kandori ................ H02N 1/006
310/300
2015/0365017 A1* 12/2015 Kandori ................ G01L 1/142
367/7

* cited by examiner

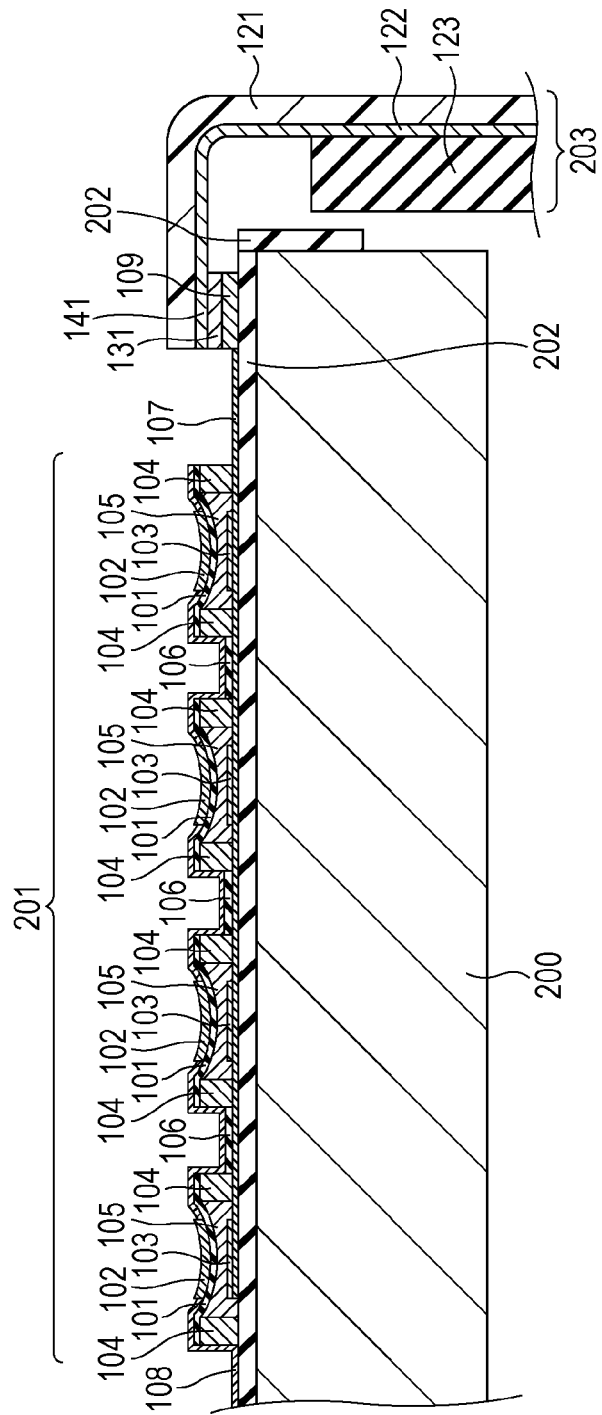

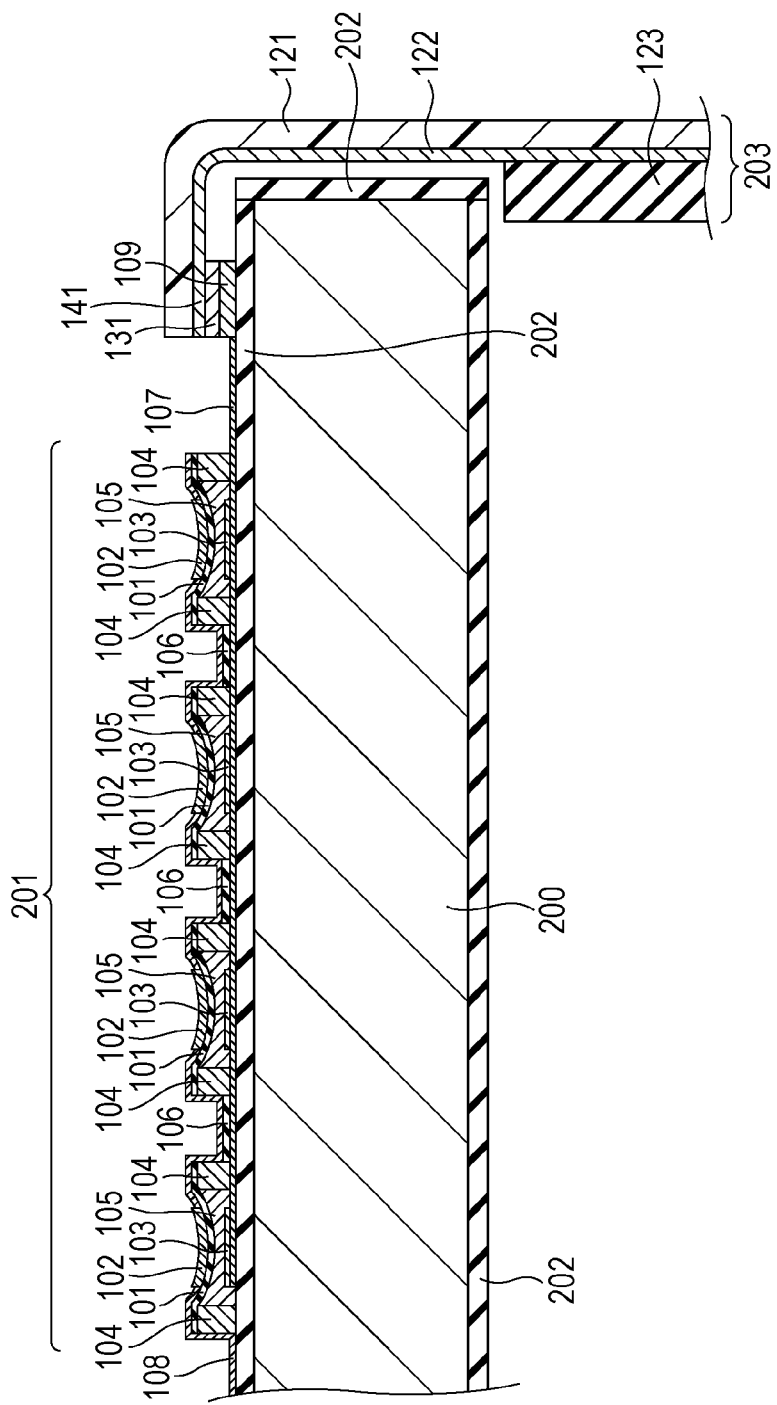

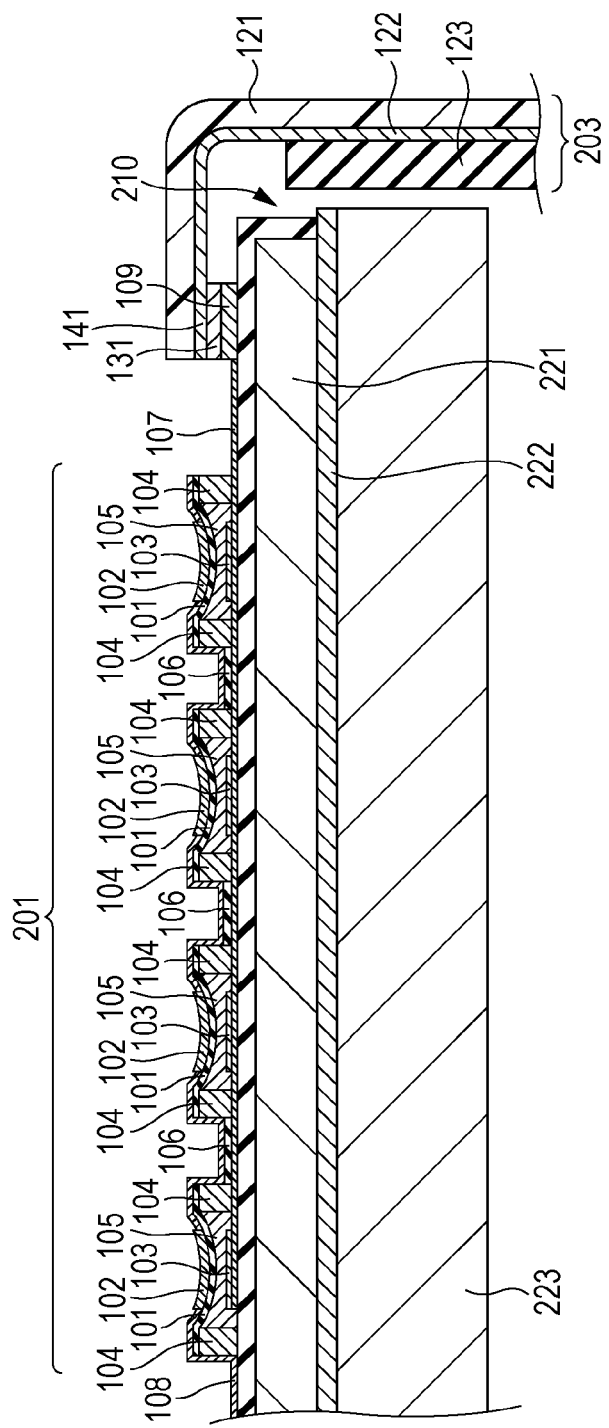

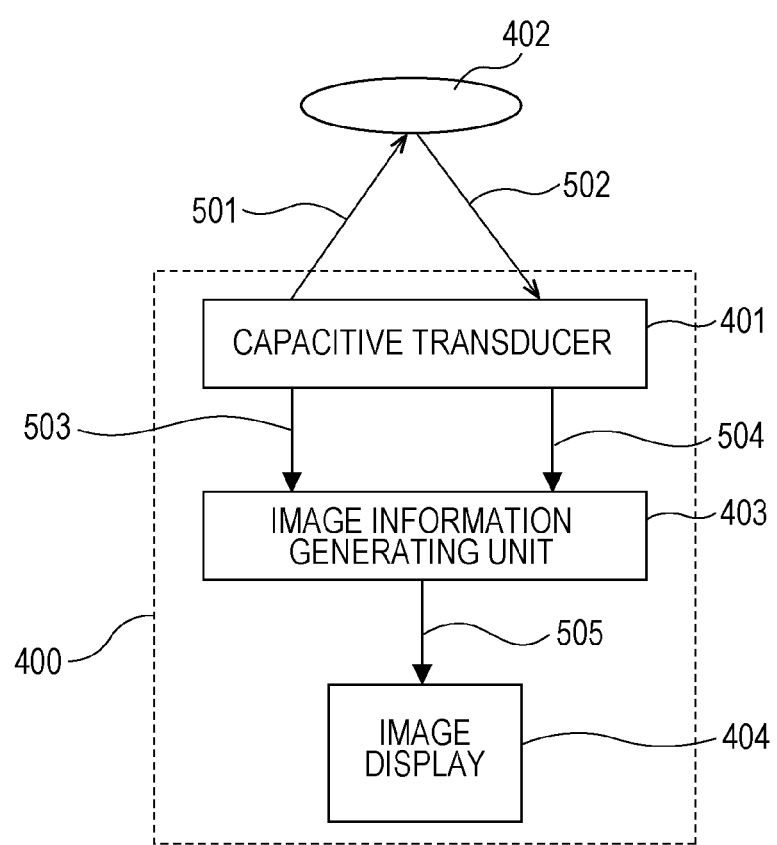

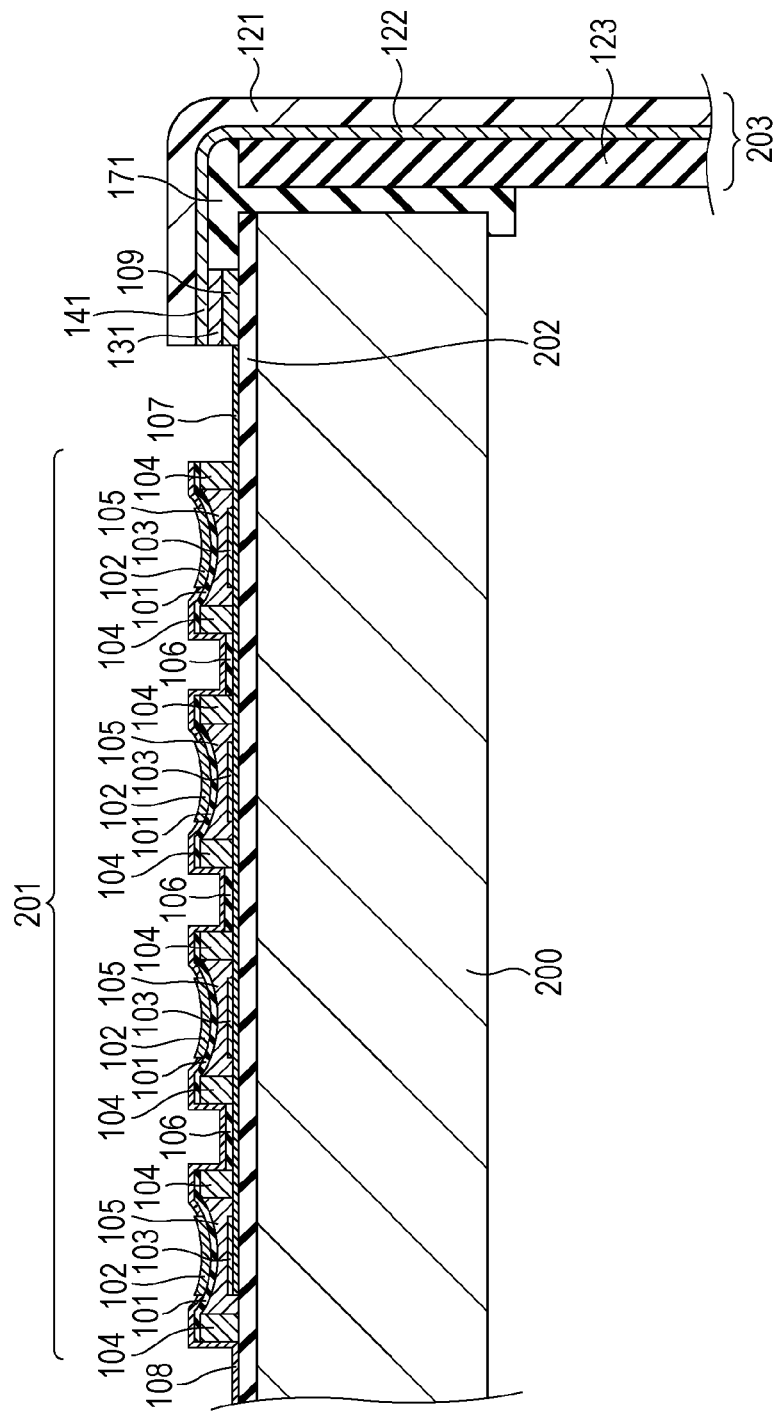

TRANSDUCER AND MEASUREMENT APPARATUS

BACKGROUND

Field of the Invention

The present disclosure relates to a transducer that transmits and receives an elastic wave, such as an ultrasonic wave, and a measurement apparatus using the transducer. As used herein, the term "transmitting and receiving" refers to at least one of transmitting and receiving.

Description of the Related Art

To transmit and receive an ultrasonic wave, a capacitive micromachined ultrasonic transducer (CMUT), which is one type of capacitive ultrasonic transducer, has been developed (a CMUT is described in, for example, A. S. Ergun, Y. Huang, X. Zhuang, O. Oralkan, G. G. Yarahoglu, and B. T. Khuri-Yakub, "Capacitive micromachined ultrasonic transducers: fabrication technology," Ultrasonics, Ferroelectrics and Frequency Control, IEEE Transactions on, vol. 52, no. 12, pp. 2242-2258, December 2005.) A CMUT is fabricated through a micro electro mechanical systems (MEMS) process using a semiconductor process.

FIG. 11 is a schematic cross-sectional view of a CMUT. As used herein, a set of a first electrode 102 and a second electrode 103 that face each other with a vibrating membrane 101 and a gap 105 therebetween is referred to as a "cell". The vibrating membrane 101 is supported by a supporting portion 104 disposed on a substrate 200. A DC voltage generating unit 301 is connected to the first electrode 102, and a predetermined DC voltage Va is applied to the first electrode 102. The second electrode 103 is connected to a transmitting and receiving circuit 302. The second electrode 103 has a fixed potential that is close to a GND potential. In this manner, a potential difference Vbias (=Va−0 V) occurs between the first and second electrodes. By controlling Va, the value of Vbias is made equal to a desired potential difference determined by the mechanical property of the cell (several tens to several hundred volts).

If the transmitting and receiving circuit 302 applies an AC drive voltage to the second electrode 103, an AC electrostatic attraction force is generated between the first and second electrodes. Thus, the vibrating membrane 101 vibrates at a certain frequency to transmit an ultrasonic wave. In addition, upon receiving an ultrasonic wave, the vibrating membrane 101 vibrates. Thus, a small electric current flows in the second electrode 103 due to electrostatic induction. By measuring the value of the electric current using the transmitting and receiving circuit 302, a received signal can be retrieved. Note that while the above description has been made with reference to the DC voltage generating unit connected to the first electrode 102 and the transmitting and receiving circuit connected to the second electrode 103, a configuration in which the connections are reversed can be employed in the same manner.

An issue regarding the above-described configuration is described below with reference to FIGS. 12A and 12B. FIG. 12A illustrates the substrate 200 having a CMUT 201 mounted thereon. As an electric connection unit that connects connection electrodes 109 and 110 connected to a cell (a CMUT) 201 on a chip to the external DC voltage generating unit 301 and the transmitting and receiving circuit 302, a flexible print circuit board is used. A flexible printed circuit board is formed by forming a patterned conductive foil on an insulating film, such as a polyimide film, (hereinafter also referred to as a "base film"). The conductive foil is made of a metal, such as copper. In general, the conductive foil is about ten micrometers to several tens micrometers in thickness. The conductive foil of the base film (except for a connector portion and a conductive portion with another electrode) is covered with an insulating film, such as a polyimide film or a photo solder resist film, (hereinafter also referred to as a "coverlay"). Thus, the conductive foil is protected. Each of the base film and the coverlay is about ten micrometers to several tens micrometers in thickness. The flexible printed circuit board is several tens micrometers to a hundred and several tens micrometers in thickness. Since the flexible printed circuit board is thinner than a widely used circuit board and interconnection lines, the flexible printed circuit board is flexible and deformable.

FIG. 12B is a schematic cross-sectional view of the substrate 200 and a flexible printed circuit board 203 connected to the substrate 200 (part of a cross-sectional view taken along a line XIIB-XIIB of FIG. 12A). A connection electrode 109 disposed on the surface of the substrate 200 having a cell of a CMUT thereon and an exposed region (a flexi-side connection electrode) 141 of the conductive foil 122 of the flexible printed circuit board 203 are disposed so as to face each other. By electrically connecting the connection electrode 109 to the connection electrode 141 using an electric connecting portion 131, an electrode connected to the cell 201 can be easily connected to, for example, the external DC voltage generating unit 301 and the transmitting and receiving circuit 302. As the electric connecting portion 131, a solder bump, a gold bump, an anisotropically conductive film (ACF), or an anisotropically conductive paste (ACP), which is widely used in semiconductor flip-chip mounting, can be employed. Thus, stick-out of interconnection lines on the substrate 200 can be reduced from that in connection between the electrode of the substrate 200 and the DC voltage generating unit 301 and the transmitting and receiving circuit 302 using wire bonding.

After cells are formed on a semiconductor wafer, the wafer is cut into individual chips using a dicing saw (hereinafter, this process is also referred to "dicing"). Thus, the substrate 200 is formed. Accordingly, even when a surface of the substrate 200 (in the form of a wafer) is covered with the insulation layer 202, a semiconductor is exposed on the side surface of the substrate 200 after dicing is performed. Accordingly, if the conductive foil 122 exposed on the flexible printed circuit board 203 is brought into contact with the side surface of the substrate 200, the substrate 200 and the conductive foil (the interconnection line) 122 are short-circuited. This problem can be solved if an arrangement in which the coverlay 123 of the flexible printed circuit board 203 is placed over the substrate 200 is employed. However, in such a case, since the thickness of the coverlay 123 is significantly greater than the thickness of the connection electrode 109 and the flexi-side connection electrode 141, the flexible printed circuit board on the substrate 200 sticks out from the surface of the chip beyond the thickness of the base film 121. If the flexible printed circuit board 203 significantly sticks out, the lower limit of the thickness of the protection film may be increased in a process to form a protection film on the substrate 200. In addition, the lower limit of a distance between an acoustic lens and the chip may be increased in a process to mount the acoustic lens on the substrate 200. Thus, the transmission and reception performance may be deteriorated.

SUMMARY

To address the above-described issue, a transducer as disclosed herein includes a substrate, an element disposed on the substrate, where the element includes an electrode, a connection electrode disposed on a surface of the substrate having the element disposed thereon, where the connection electrode is electrically connected to the electrode, and a flexible print circuit board including an insulating film and a conductive portion disposed on the insulating film, where the conductive portion is electrically connected to the connection electrode. Part of the conductive portion is exposed so as to face an upper surface of the substrate having the element disposed thereon, and an insulation layer is disposed on part of the upper surface of the substrate facing the flexible print circuit board.

Further features of the present invention will become apparent from the following description of exemplary embodiments with reference to the attached drawings.

BRIEF DESCRIPTION OF THE DRAWINGS

FIGS. 2A and 2B illustrate a transducer according to a second exemplary embodiment.

FIGS. 6A to 6C illustrate a transducer according to a sixth exemplary embodiment.

FIG. 8 illustrates an ultrasonic measurement apparatus according to an eighth exemplary embodiment.

FIGS. 13A to 13D illustrate an ultrasonic measurement apparatus according to a tenth exemplary embodiment.

DESCRIPTION OF THE EMBODIMENTS

A transducer according to exemplary embodiments of the present disclosure has the following two characteristics. A first characteristic is that a flexible print circuit board does not have a coverlay (an insulating film) on the conductive foil (a conductive portion) disposed on the base film in a region in which the flexible print circuit board is located on the measurement object side from the surface of the substrate having a CMUT disposed thereon (i.e., a region outside a substrate in the thickness direction of the substrate). A second characteristic is that an insulation layer is disposed on a portion of the surface of the substrate having a CMUT disposed thereon that faces the flexible print circuit board. That is, in a transducer including an element that is disposed on the substrate and that has an electrode, a connection electrode that is disposed on the surface of the substrate having the element thereon and that is electrically connected to the electrode, and a flexible print circuit board, part of the conductive portion of the flexible print circuit board that is exposed to the surface of the substrate having the element disposed thereon. In addition, part of the surface of the substrate that faces the conductive portion of the flexible print circuit board has the insulation layer disposed thereon. Examples of the element include a cell and a piezoelectric element. Note that the cell includes a vibrating membrane, which includes a first electrode, and a second electrode disposed on the substrate with a spacing from the first electrode.

The transducer and a measurement apparatus using the transducer according to exemplary embodiments of the present invention are described in detail below with reference to the accompanying drawings.

First Exemplary Embodiment

Figure 1:
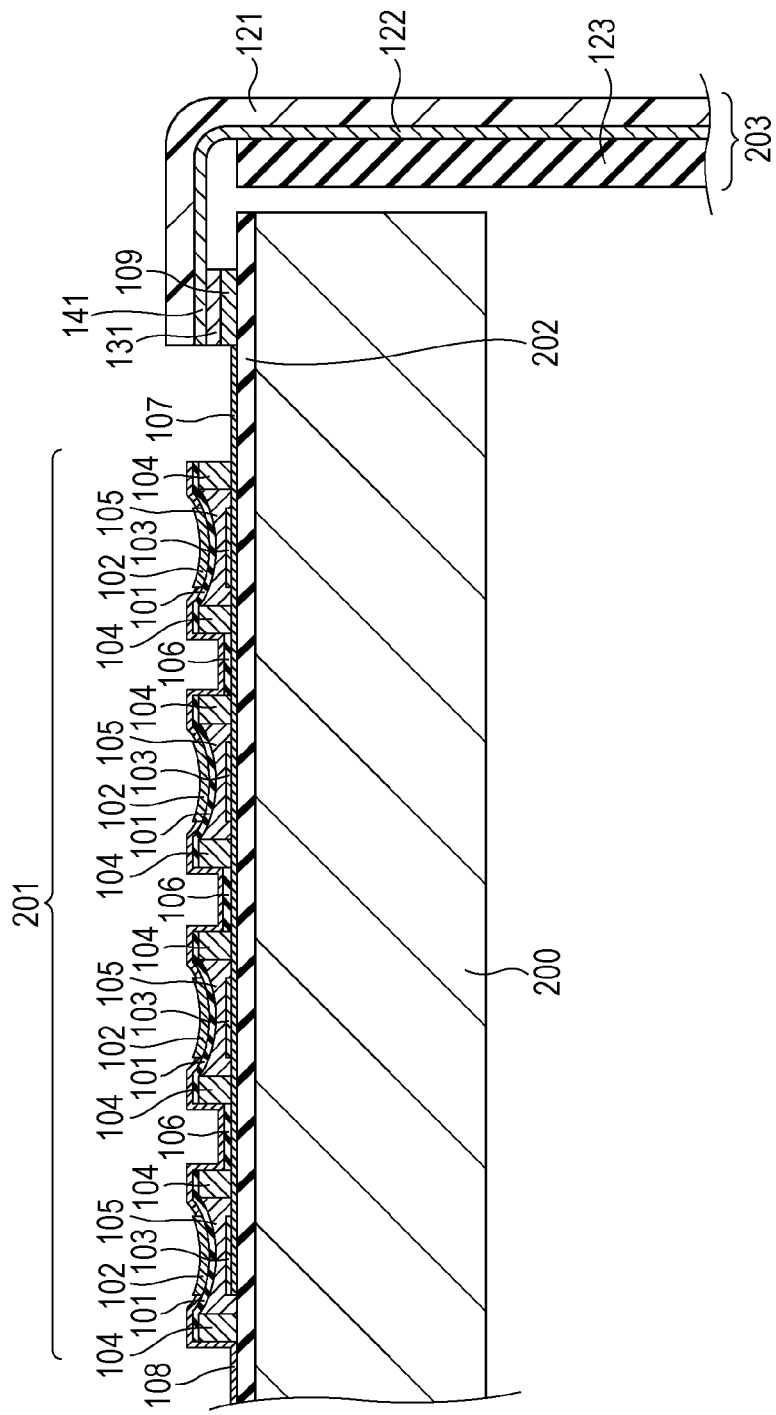
FIG. 1 illustrates a transducer according to a first exemplary embodiment.

FIG. 1 is a schematic illustration of a capacitive transducer according to a first exemplary embodiment. As illustrated in FIG. 1, the capacitive transducer includes a vibrating membrane 101, a first electrode 102, a second electrode 103, a supporting portion 104, a cavity 105, and an insulating film 106. The capacitive transducer further includes interconnection lines 107 and 108, a connection electrode 109, a substrate 200, and an electromechanical transducer 201 (hereinafter, a CMUT may be representative of the electromechanical transducer), an insulation layer 202 formed on the surface of the substrate 200, and a flexible print circuit board 203. Hereinafter, the structure including the substrate 200 and the insulation layer 202 is referred to as a "chip". In addition, a surface of chip having the CMUT 201 mounted thereon is also referred to as an "upper surface", and a surface of chip having no CMUT 201 mounted thereon is also referred to as a "lower surface"

The insulation layer 202 is formed on the upper surface of the substrate 200. The insulation layer 202 has a cell of CMUT disposed thereon. The cell includes the vibrating membrane 101, the first electrode 102, the second electrode 103, the supporting portion 104, and the cavity 105. The first electrode 102, the interconnection line 108 connected to the first electrode 102, and the interconnection line 107 connected to the second electrode 103 are electrically insulated from the substrate 200. The interconnection line 107 connected to the second electrode 103 is connected to the connection electrode 109 for connection with the flexible printed circuit board 203. The chip is easily formed by forming the insulation layer 202 on a semiconductor wafer, such as a silicon wafer, having a thickness of several hundred micrometers, forming a CMUT on the insulation layer 202, and dicing the semiconductor wafer into chips.

The flexible printed circuit board 203 includes the base film 121 having the conductive foil 122 disposed thereon. The conductive foil 122 serves as a patterned conductive portion. The coverlay 123 is disposed on part of the surface of the base film 121 having the conductive foil 122 formed thereon. The coverlay 123 serves as an insulation layer. The base film 121 can be formed from an insulating film made of, for example, polyimide. The insulating film is ten micrometers to several tens micrometers in thickness. The conductive foil 122 can be formed from a metal foil, such as a copper foil, having a thickness of ten micrometers to several tens micrometers. In addition, the coverlay 123 is formed from an insulating film, such as a polyimide film or the photo solder resist film. The thickness of the insulating film is ten micrometers to several tens micrometers.

Firstly, the transducer of the present exemplary embodiment is characterized in that the coverlay 123 is not disposed in a region of the flexible printed circuit board 203 located on the measurement object side from a plane that contains the upper surface of the substrate 200 (on the upper side in the thickness direction of the chip in FIG. 1). That is, the coverlay 123 is disposed on part of a surface of the flexible printed circuit board 203 that faces the side surface of the substrate 200 in substantially parallel (a side surface that continuously extends from the upper surface through a corner). This structure can reduce the length of part of the flexible printed circuit board 203 that sticks out from the upper surface of the substrate 200 toward the measurement object. More specifically, the length of stick-out can be set to a value substantially equal to the sum of the thickness of the base film 121 of the flexible printed circuit board 203, the thickness of the conductive foil 122, the thickness of the connection electrode 109 disposed on the substrate 200, and the thickness of the connection electrode 141.

Secondly, the transducer of the present exemplary embodiment is characterized in that the insulation layer 202 is disposed on part of a surface of the substrate 200 having a CMUT disposed thereon that faces the flexible printed circuit board 203. Thus, even when the conductive foil 122 exposed on the flexible printed circuit board 203 to the surface of the chip is brought into contact with the surface of the chip, the interconnection line (the conductive foil 122) of the flexible print circuit board 203 is not brought into electrical contact with the substrate 200, since the substrate 200 is insulated with the insulation layer 202. Thus, each of the interconnection lines of the flexible printed circuit board 203 can be electrically insulated from the substrate 200. In addition, the interconnection lines of the flexible print circuit board 203 can be electrically insulated from one another. Note that the insulation layer 202 is formed by thermally oxidizing a parent material of the substrate, such as a silicon substrate, depositing oxide on the substrate, or depositing nitride on the substrate so as to have an insulation property. Any insulation layer 202 that does not cause a problem in a CMUT forming process can be employed.

According to the present exemplary embodiment, the interconnection line can be connected to, for example, an external circuit without sticking out the flexible printed circuit board while ensuring electrical insulation between the substrate and the interconnection line. Accordingly, a thin protection film can be disposed on a chip. In addition, an acoustic lens can be disposed in close proximity to the chip. As a result, a capacitive transducer having a high transmission and reception performance and an apparatus using such a capacitive transducer can be provided.

While the present exemplary embodiment has been described with reference to the interconnection line of the flexible printed circuit board 203 connected to the interconnection line 107 electrically connected to the second electrode 103, the configuration is not limited thereto. The interconnection line of the flexible printed circuit board 203 may be connected to the interconnection line 108 electrically connected to the first electrode 102. Alternatively, the flexible printed circuit board 203 may have a plurality of interconnection lines electrically insulated from one another, and each of the interconnection line may be connected to a corresponding interconnection line 107 or interconnection line 108. In such a case, the interconnection line of the first electrode 102 and the interconnection line of the second electrode 103 can be connected to a circuit at the same time using a single flexible printed circuit board. Accordingly, a compact capacitive transducer can be provided.

In addition, while the present exemplary embodiment has been described with reference to the insulation layer 202 disposed on only a surface of the substrate 200 having a CMUT mounted thereon, the configuration is not limited thereto. For example, the insulation layer 202 may be additionally disposed on the lower surface of the substrate 200, which is a surface opposite to the surface having a CMUT mounted thereon. In such a case, since the insulation layers 202 are formed on either side of the substrate 200, the stresses received by the two surfaces of the substrate 200 from the insulation layers 202 are canceled out and, thus, bending of the chip can be prevented.

Second Exemplary Embodiment

According to a second exemplary embodiment, the structure of the side surface of the substrate 200 differs from that according to the first exemplary embodiment. The other elements are the same as those of the first exemplary embodiment. The present exemplary embodiment is characterized in that the insulation layer 202 is disposed along the side surface of the substrate 200. FIGS. 2A and 2B are schematic cross-sectional views of a capacitive transducer according to the present exemplary embodiment.

As illustrated in FIG. 2A, the insulation layer 202 is disposed on the CMUT forming surface of the substrate 200 and is continuously disposed on an end portion of the CMUT forming surface and part of the side surface of the substrate 200. Since part of the side surface of the substrate 200 is covered by the insulation layer 202, insulation of the interconnection line of the flexible printed circuit board 203 from the substrate 200 can be ensured even when the top end portion of the coverlay 123 disposed on the flexible printed circuit board 203 that is bent along the end portion of the substrate 200 that extends from the upper surface to the side surface of the substrate 200 is not at the same height level as the upper surface of the substrate 200. Accordingly, even when the surface of a chip having a CMUT formed thereon is not at the same level as the coverlay 123 of the flexible printed circuit board 203 having an exposed conductive portion that faces the end portion of the substrate at the bent portion, the interconnection line of the flexible printed circuit board 203 can be insulated from the substrate 200.

The insulation layer can be easily disposed on the side surface of the substrate by depositing the insulation layer. More specifically, by preventing the insulation layer from depositing on the surface having a CMUT formed thereon using a stencil mask or a resist, the insulation layer can be selectively formed on the side surface of the substrate 200. According to the present exemplary embodiment, a very high positioning accuracy of the coverlay 123 relative to the flexible print circuit board 203 is not required and, thus, electrical insulation can be easily achieved. Accordingly, the flexible printed circuit board 203 that is inexpensive can be employed. In addition, a very high positioning accuracy of an electrode relative to another electrode is not required in a process in which the flexible printed circuit board 203 is connected to the connection electrode and, thus, the process can be simplified.

FIG. 2B illustrates another form of the present exemplary embodiment. As illustrated in FIG. 2B, the insulation layer 202 is disposed on the entire surface of the substrate 200 including the side surface. In addition, the coverlay 123 is not disposed on part of the flexible printed circuit board 203 that faces the side surface of the substrate 200. Since the insulation layer 202 is disposed on the side surface of the substrate 200, electrical insulation between the interconnection line of the flexible printed circuit board 203 and the substrate 200 can be ensured even when the coverlay 123 is not provided. As a result, the coverlay 123 need not be disposed on part of the flexible printed circuit board 203 that faces the side surface of the substrate 200.

According to the present exemplary embodiment, since the coverlay 123 is not disposed on the part of the flexible printed circuit board 203 that faces the side surface of the substrate 200, the width of the flexible printed circuit board in the horizontal direction of the substrate 200 can be reduced by the thickness of the coverlay. In addition, a very high positional accuracy is not required when the coverlay 123 is disposed on the flexible printed circuit board 203 and, thus, the flexible printed circuit board 203 with a simplified structure can be produced. That is, the flexible printed circuit board 203 can be mounted with coarse positioning accuracy. As a result, the capacitive transducer can be provided at low lost.

Third Exemplary Embodiment

Figure 3:
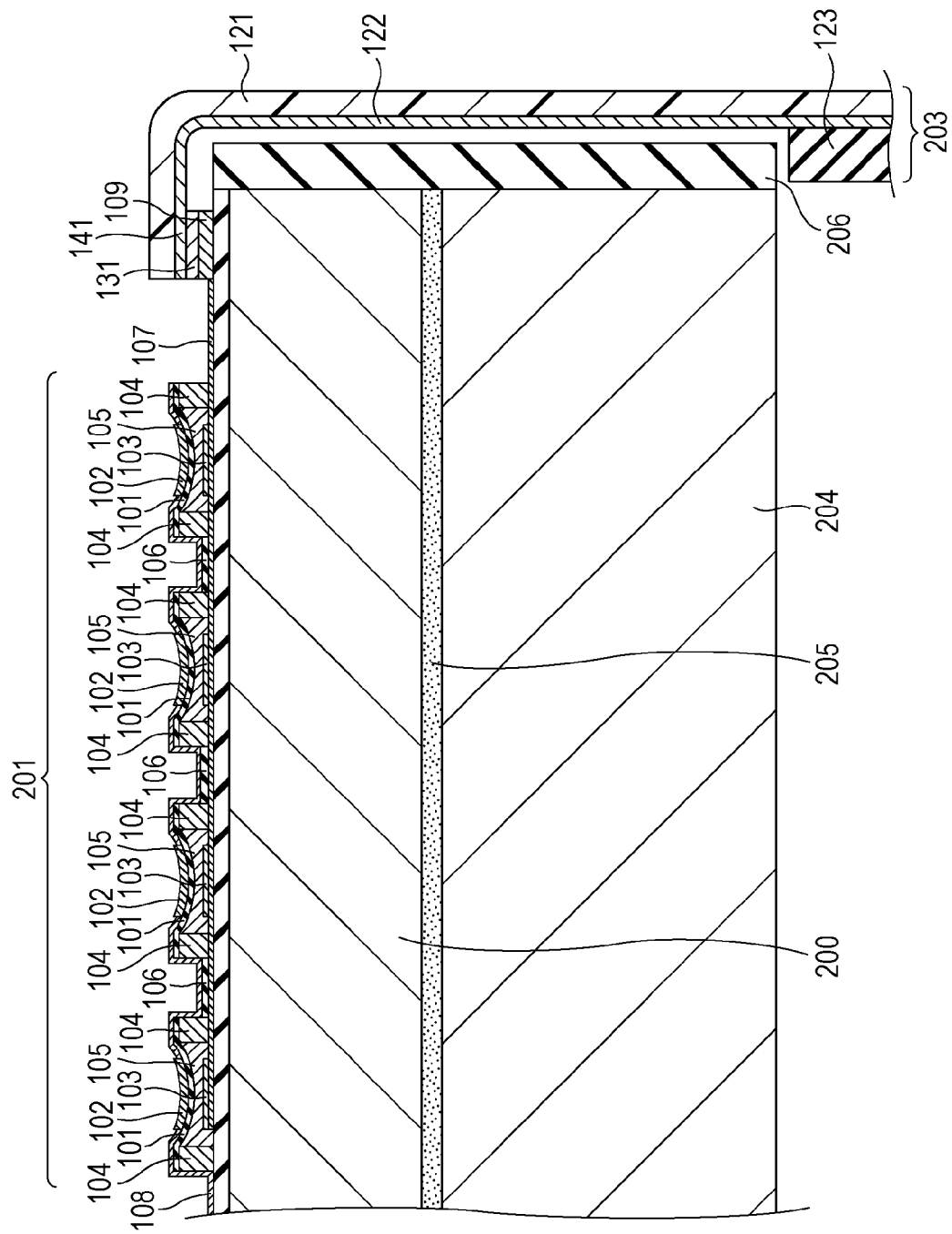
FIG. 3 illustrates a transducer according to a third exemplary embodiment.

Unlike the above-described exemplary embodiments, a capacitive transducer according to a third exemplary embodiment includes a member that supports the substrate 200. The other elements are the same as those of the first exemplary embodiment. The present exemplary embodiment is characterized in that a support member is provided on the lower surface of the substrate 200 and, in addition, the insulation layer is disposed on the side surfaces of the support member and the substrate 200. FIG. 3 is a schematic cross-sectional view of the capacitive transducer according to the present exemplary embodiment. In FIG. 3, a support member 204, an adhesive layer 205, and an insulation layer 206 are illustrated. The substrate 200 having a CMUT 201 formed thereon is disposed on the support member 204 via the adhesive layer 205. The position of a side surface of the support member 204 adjacent to the flexible printed circuit board 203 in the horizontal direction is substantially the same as the position of the side surface of the substrate 200 and, thus, the two side surfaces are substantially flush with each other. According to the present exemplary embodiment, the insulation layer 206 is disposed on the flush surface by simple adhesion or pressure-sensitive adhesion.

According to the present exemplary embodiment, the support member 204 can be formed of resin. The support member 204 is several millimeters to several centimeters in thickness, which is greater than the thickness of the chip (several hundred micrometers). Since the thickness of the support member 204 is greater than the thickness of the substrate 200, the area of the surface having the insulation layer 206 disposed thereon can be increased from the area of only the side surface of the substrate 200. Accordingly, the area used for bonding the insulation layer 206 can be increased. As a result, the insulation layer 206 can be easily and reliably disposed on the side surfaces.

According to the present exemplary embodiment, the insulation layer 206 can be formed from a thin film having an insulation property, such as a thin film formed of polyester, polyimide, PET, or PEN. The insulation layer 206 can be ten micrometers to several tens micrometers in thickness. Accordingly, the thickness of the insulation layer 206 can be increased from that in the case in which the insulation layer 206 is deposited on only the side surface of the substrate and, thus, the insulation layer 206 does not have, for example, a pin hole. In this manner, the insulation property can be improved. In addition, any type of adhesive layer that adheres the substrate 200 to the support member 204 can be used as the adhesive layer 205 disposed between the substrate 200 and the support member 204. The adhesive layer 205 can be formed of, for example, an epoxy adhesive agent, an urethane adhesive agent, an acrylic adhesive agent, or a silicone adhesive agent.

According to the present exemplary embodiment, an insulation layer having a high insulating property can be employed. Thus, the insulation property between the interconnection line of the flexible printed circuit board 203 and the substrate 200 can be improved. As a result, a highly reliable capacitive transducer can be provided.

Fourth Exemplary Embodiment

Figure 4:
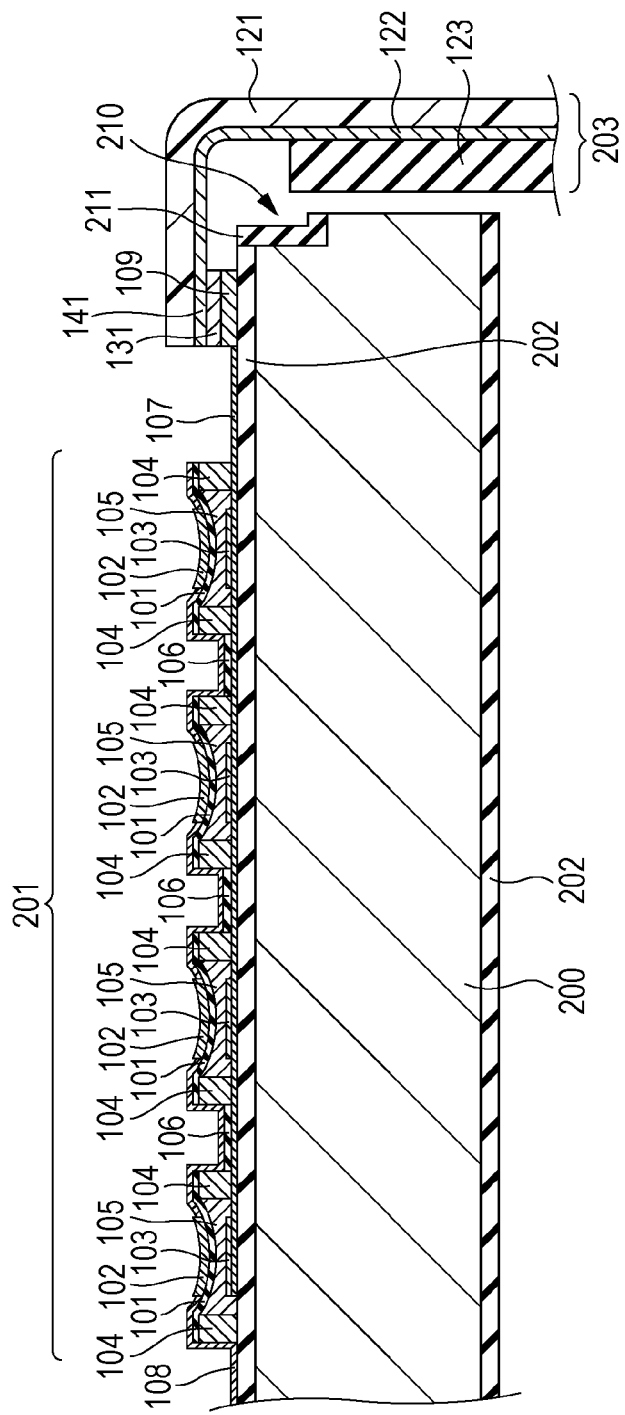
FIG. 4 illustrates a transducer according to a fourth exemplary embodiment.

According to a fourth exemplary embodiment, the shape of the side surface of the substrate 200 differs from those of the above-described exemplary embodiments. The other elements are the same as those of the second exemplary embodiment. The present exemplary embodiment is characterized in that a corner of the substrate 200 on the side on which a CMUT is formed has a concave portion and, in addition, the surface of the concave portion is covered by an insulation layer. FIG. 4 is a schematic cross-sectional view of a capacitive transducer according to the present exemplary embodiment. In FIG. 4, a concave portion 210 and an insulation layer 211 located inside the concave portion 210 are illustrated.

A corner of the substrate 200 formed by the side surface adjacent to the flexible printed circuit board 203 and the surface having a CMUT formed thereon is not sharp. Instead, the corner has the concave portion 210. The concave portion 210 can have a width of several tens micrometers to about a hundred micrometer and a depth of several tens micrometers to about a hundred micrometer. In addition, the surface of the concave portion 210 of the substrate 200 is covered by the insulation layer 211. The insulation layer 211 can be formed from any insulation layer, such as an insulation layer formed by thermally oxidizing a parent material of the substrate, such as a silicon substrate, depositing oxide on the substrate, or depositing nitride on the substrate so as to have an insulation property. The insulation layer 211 that covers the concave portion 210 and other concave portions can be easily formed through an MEMS process.

According to the present exemplary embodiment, a corner of the substrate 200 has a concave portion in a region where a bent portion of the flexible printed circuit board 203 having an exposed conductive portion that faces at least part of the surface of the concave portion 210 is located. Accordingly, the flexible printed circuit board 203 is negligibly brought into physical contact with the substrate 200. Thus, the flexible printed circuit board 203 does not scrape against the substrate 200, since contact between the flexible printed circuit board 203 and the substrate 200 does not occur. Consequently, damage of the interconnection line of the flexible printed circuit board 203 can be prevented. As a result, the capacitive transducer having a highly reliable interconnection line can be provided.

Fifth Exemplary Embodiment

According to a fifth exemplary embodiment, a method for manufacturing the capacitive transducer according to the fourth exemplary embodiment is described. FIGS. 5A to 5H are schematic cross-sectional views illustrating the method for manufacturing the capacitive transducer. In FIGS. 5A to 5H, part of the cross section of the semiconductor wafer is illustrated.

Figure 5A:
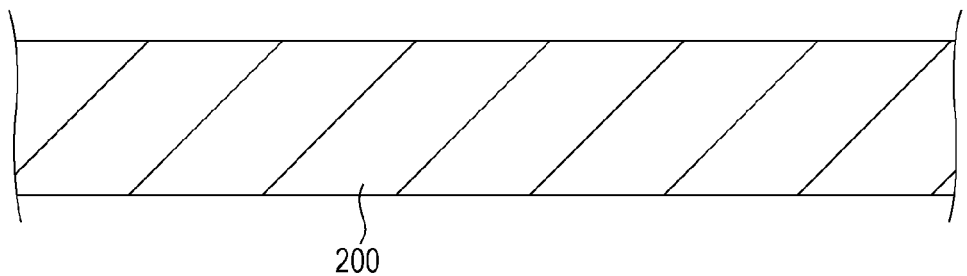
FIGS. 5A to 5C illustrate a method for manufacturing a transducer according to a fifth exemplary embodiment.
Figure 5B:
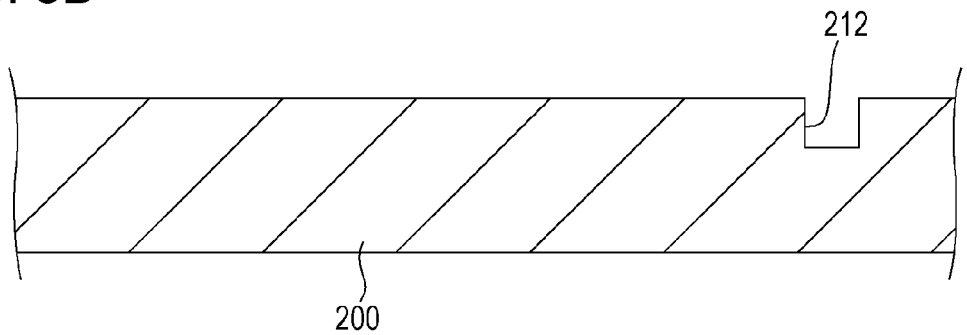

A groove 212 is formed on the upper surface of the substrate 200 illustrated in FIG. 5A by etching first (FIG. 5B). To form the groove 212, a resist is applied to the upper surface. Thereafter, part of the resist is removed, and dry etching or wet etching is performed. In this manner, the groove 211 can be easily formed. The width of the groove 212 needs to be greater than the width of a blade used for dicing. It is desirable that the width of the groove 212 be 50 micrometers to several hundred micrometers. In addition, the depth of the groove 212 can be easily set to any value by controlling the etching time. More specifically, it is desirable that the depth of the groove 212 be less than or equal to one-tenth to one-third the thickness of the silicon wafer. The depth can be set to an appropriate value by taking into account a balance between the effect of the groove 212 on the manufacturing process and the positional accuracy of the coverlay 123 on the flexible printed circuit board 203.

Figure 5C:
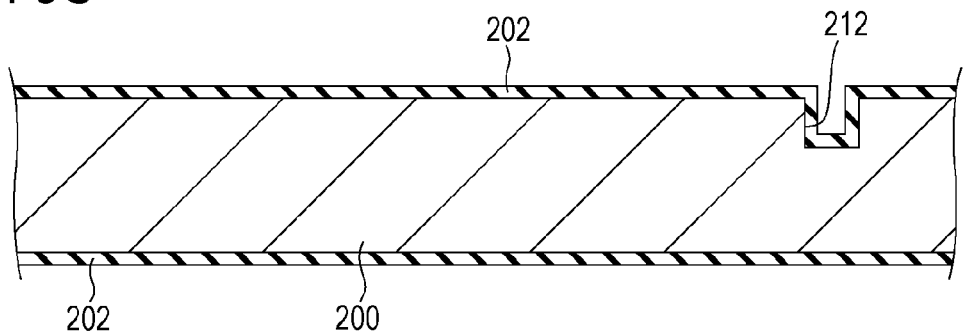
Figure 5D:
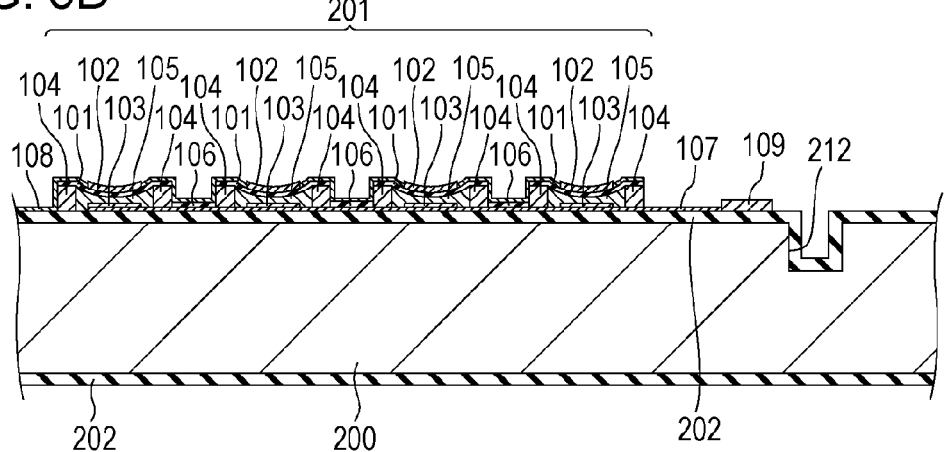
FIGS. 5D to 5F illustrate the method for manufacturing a transducer according to the fifth exemplary embodiment.

Subsequently, the insulation layer 202 is formed on the upper surface of the wafer having the groove 212 formed therein (FIG. 5C). Thereafter, the CMUT 201 is formed on the insulation layer 202 formed on the upper surface using a widely used process (FIG. 5D). FIG. 5H is a schematic illustration of part of the wafer at that time. Note that the insulation layer 202 is not illustrated in FIG. 5H.

Figure 5E:
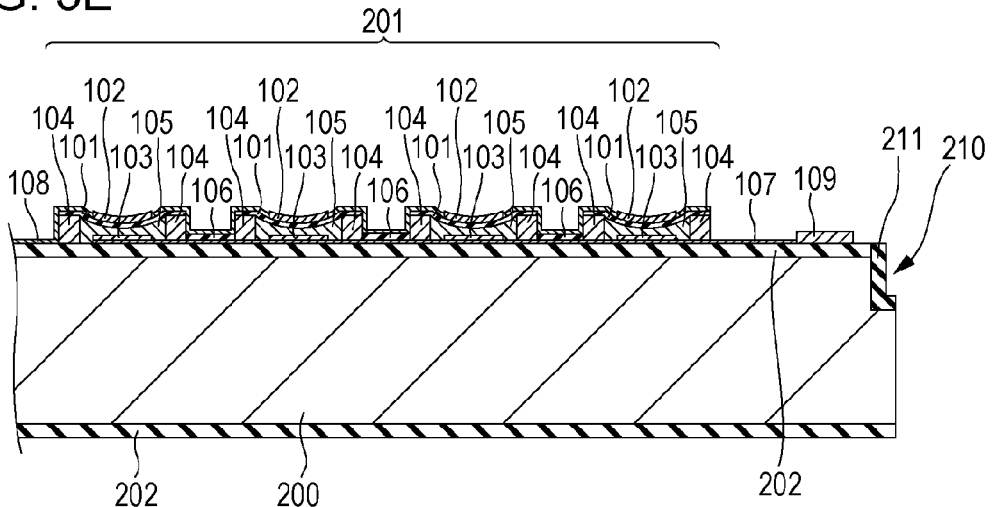
Figure 5F:
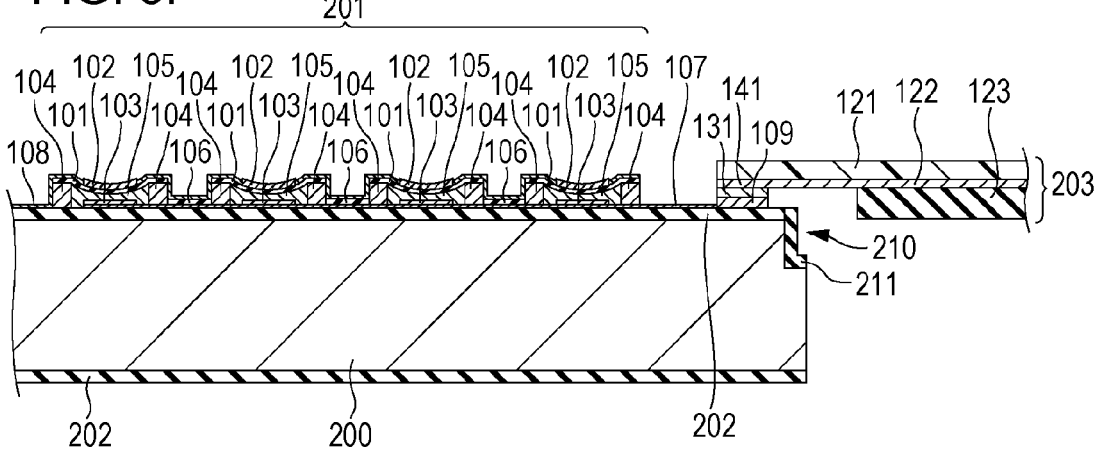
Figure 5G:
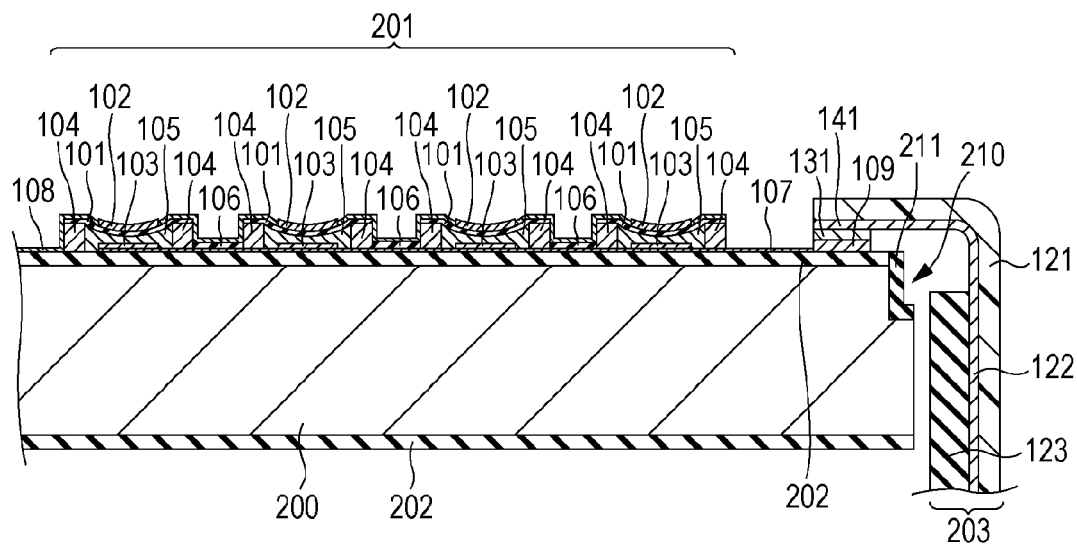
FIGS. 5G and 5H illustrate the method for manufacturing a transducer according to the fifth exemplary embodiment.
Figure 5H:
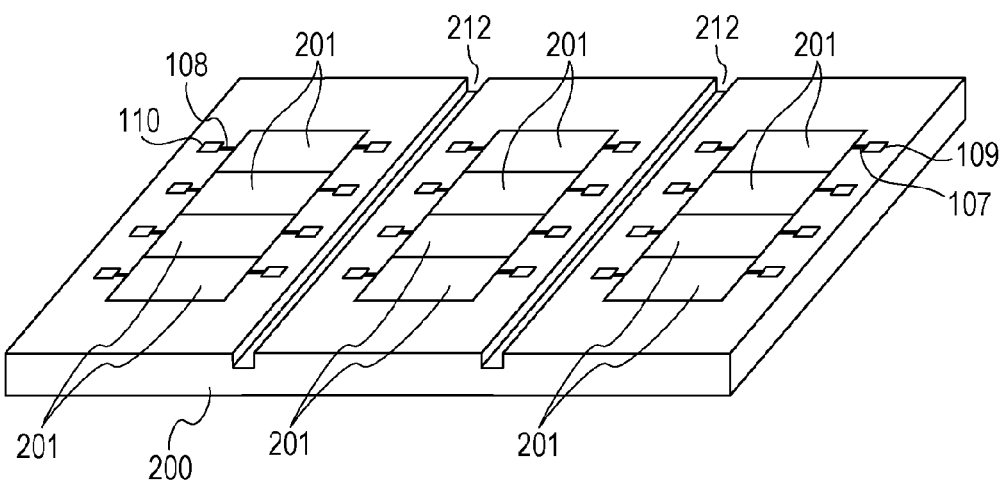

Subsequently, the wafer is cut at substantially the center of the groove 212 by dicing and is separated into pieces (FIG. 5E). In this manner, the substrate 200 does not have a sharp corner and has the concave portion 210. In addition, the surface of the concave portion 210 is covered by the insulation layer 202. Finally, the connection electrode 141, which is the conductive portion exposed on the flexible printed circuit board 203, is connected to the connection electrode 109 on the substrate 200 using the electric connecting portion 131 (FIG. 5F). Thereafter, the flexible printed circuit board 203 is bent so as to be perpendicular to the substrate 200 (FIG. 5G).

According to the present exemplary embodiment, by simply providing the groove 212 in the surface of the wafer used for forming a CMUT, the CMUT is formed without changing the subsequent processes, and the flexible printed circuit board 203 is connected. In this manner, the interconnection line can be connected to, for example, an external circuit without stick-out of the flexible printed circuit board 203 while maintaining electrical insulation. Thus, a method for manufacturing a transducer through simplified processes can be provided.

In addition, according to the present exemplary embodiment, the insulation layer 202 can be formed by depositing oxide on the substrate of the wafer, depositing nitride on the substrate of the wafer, or thermally oxidizing a parent material of the wafer. In particular, the thermal oxide film has an excellent insulation property and, thus, is preferable as the insulation layer used for an underlayer on which a CMUT is to be formed. In addition, since the thermal oxide film can be uniformly formed on the wafer, the thermal oxide film can be formed even inside the groove without any defect. Thus, the insulation property can be reliably ensured. Furthermore, since a thermal oxide film is negligibly damaged during dicing, a thermal oxide film is particularly suitable for the present exemplary embodiment.

A transducer that includes the insulation layer 202 formed by thermally oxidizing a wafer and that is produced using the method of the present exemplary embodiment has an excellent insulation property of the insulation layer 202. Accordingly, the transducer is highly reliable. In addition, since the manufacturing process is simplified, the transducer can be manufactured at low cost.

Sixth Exemplary Embodiment

Figure 6B:
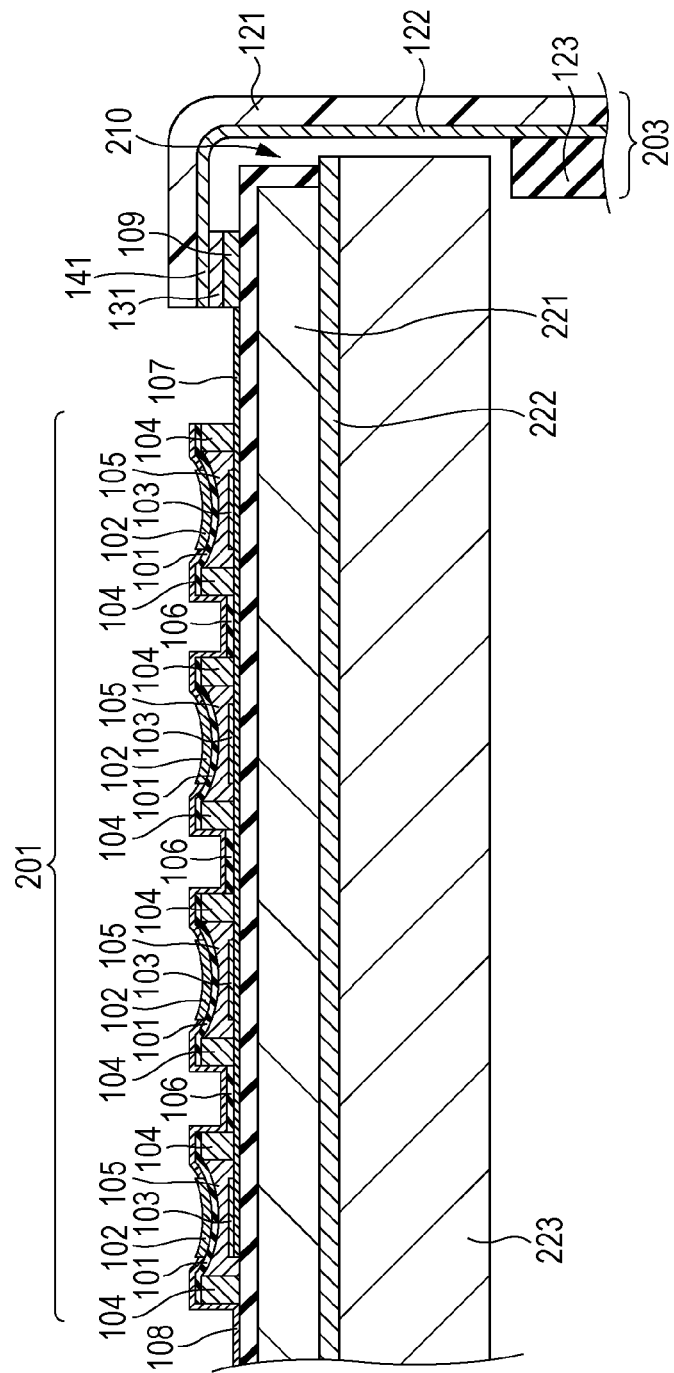
Figure 6C:
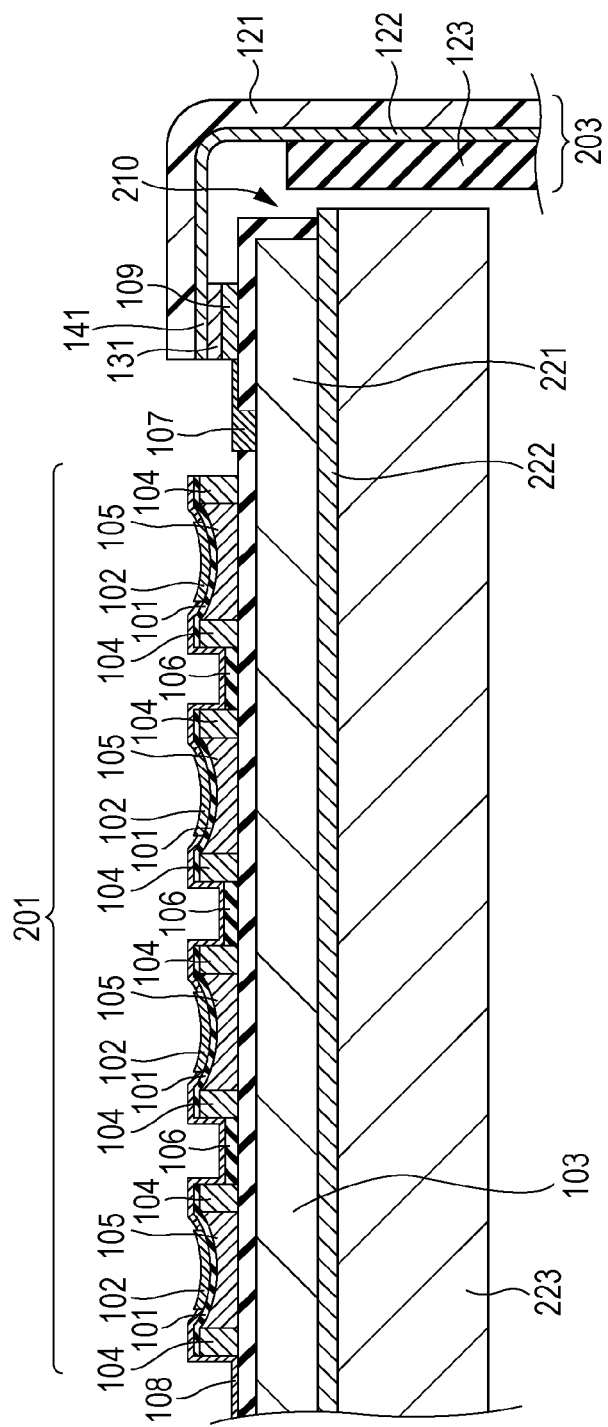

A substrate 200 according to a sixth exemplary embodiment has a configuration that differs from those of the above-described exemplary embodiments. The other elements are the same as those of the second exemplary embodiment. The present exemplary embodiment is characterized in that a silicon on insulator (SOI) substrate is used as the substrate 200 and, in addition, the side surface of an active layer of the SOI substrate is covered with an insulation layer. FIGS. 6A to 6C are schematic cross-sectional views of a capacitive transducer according to the present exemplary embodiment. In FIGS. 6A to 6C, an active layer 221, a buried oxide (BOX) layer 222, and a handle layer 223 are illustrated.

As illustrated in FIG. 6A, an SOI substrate having the active layer 221 disposed on the handle layer 223 via the BOX layer 222 is used as the substrate 200. A CMUT 201 is disposed on the upper surface of the active layer 221 via the insulation layer 202. A side surface of the substrate 200 adjacent to the flexible printed circuit board 203 has the insulation layer 202 formed thereon. A portion of the flexible printed circuit board 203 that faces a side surface of the handle layer 223 has the coverlay 123 disposed thereon.

According to the present exemplary embodiment, the active layer 221 is surrounded by the BOX layer 222 and the insulation layer 202. Accordingly, even when the active layer 221 of the substrate 200 is connected to high potential, short-circuiting with a member in the vicinity does not occur and, thus, high reliability can be ensured. That is, even in a configuration in which the potential applied to the substrate 200 is made to be the same as the potential applied to the second electrode 103 by connecting the potential of the DC voltage generating unit 301 to the active layer 221 of the substrate 200, electrical insulation from a member in the vicinity can be ensured. If the potential of the active layer 221 and the potential of the second electrode (the lower electrode) 103 are made the same, the distribution of the electric field strength between the first electrode (the upper electrode) 102 and the second electrode (the lower electrode) 103 can be made uniform. In addition, to prevent interference from external noise, it is desirable that the potential of the active layer 221 be fixed to GND or a bias voltage. In such a case, the number of signal lines disposed on the flexible printed circuit board 203 can be reduced and, thus, the width of the flexible printed circuit board 203 can be reduced.

FIG. 6B illustrates another form of the present exemplary embodiment. In FIG. 6B, a semiconductor substrate that is weakly doped is used as the handle layer 223 of the SOI substrate serving as the substrate 200. According to the present exemplary embodiment, a semiconductor substrate that is weakly doped is used as the handle layer 223. Thus, even when the interconnection line of the flexible print circuit board 203 is brought into contact with the handle layer 223 of the substrate 200, electrical insulation can be maintained, since the handle layer 223 is connected to the interconnection line of the flexible printed circuit board 203 via very high resistance. In addition, since the coverlay 123 is not provided on a portion of the flexible printed circuit board 203 that faces the side surface of the substrate 200, the width of the flexible printed circuit board 203 in the horizontal direction of the substrate 200 can be reduced by the thickness of the coverlay.

Furthermore, a very high positional accuracy is not required when the coverlay 123 is disposed on the flexible printed circuit board 203 and, thus, the flexible printed circuit board 203 with a simplified structure can be produced. The positioning of the flexible printed circuit board 203 can be made with coarse positioning accuracy. As a result, the capacitive transducer can be provided at low lost. Note that in the forms illustrated in FIGS. 6A and 6B, the active layer 221 may further have the function of the second electrode 103, as in the form illustrated in FIG. 6C. In such a case, the interconnection line 107 is formed so as to extend through the insulation layer 202 on the upper surface of the active layer 221 and reach the connection electrode 109 on the substrate 200.

Seventh Exemplary Embodiment

According to a seventh exemplary embodiment, a method for manufacturing the capacitive transducer according to the sixth exemplary embodiment is described. FIGS. 7A to 7E are schematic cross-sectional views illustrating the method for manufacturing the capacitive transducer. In FIGS. 7A to 7E, part of the cross section of a semiconductor wafer is illustrated.

Figure 7A:
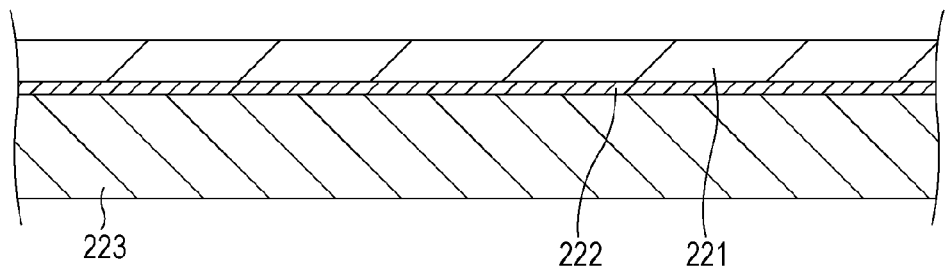
FIGS. 7A to 7C illustrate a method for manufacturing a transducer according to a seventh exemplary embodiment.
Figure 7B:
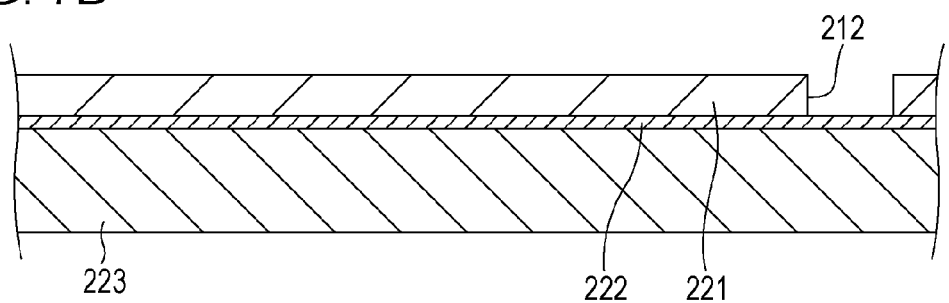

A groove 212 is formed on the upper surface of the SOI substrate illustrated in FIG. 7A having the active layer 221 disposed on the handle layer 223 via the BOX layer 222 by etching first (FIG. 7B). To form the groove 212, a resist is applied to the upper surface. Thereafter, part of the resist is removed, and dry etching or wet etching is performed. In this manner, the groove 212 can be easily formed. The width of the groove 212 needs to be greater than the width of a blade used for dicing. It is desirable that the width of the groove 212 be 50 micrometers to several hundred micrometers. In addition, the depth of the groove 212 can be easily determined from the thickness of the active layer 221 by selecting an etching technique that stops etching at the position of the BOX layer 222. More specifically, it is desirable that the depth of the groove 212 be less than or equal to one-tenth to one-third the thickness of the silicon wafer. The depth can be set to an appropriate value by taking into account a balance between the effect of the groove 212 on the manufacturing process and the positional accuracy of the coverlay 123 on the flexible printed circuit board 203.

Figure 7C:
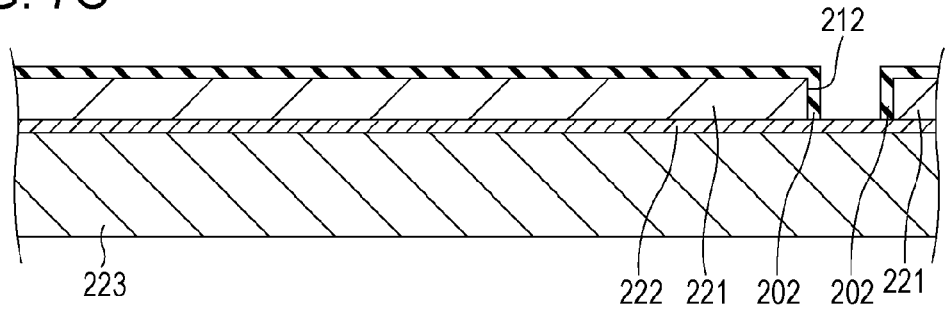
Figure 7D:
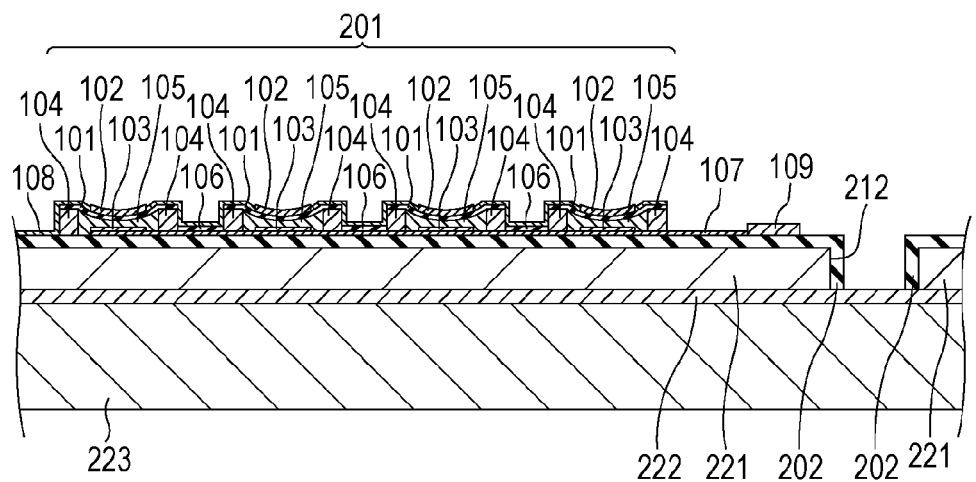
FIGS. 7D and 7E illustrate the method for manufacturing a transducer according to the seventh exemplary embodiment.
Figure 7E:
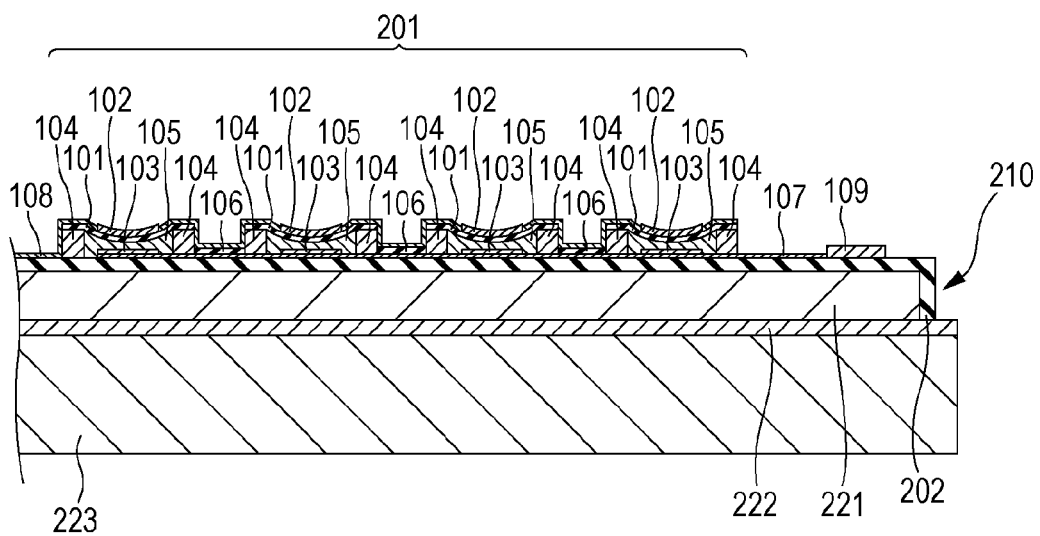

Subsequently, the insulation layer 202 is formed on the upper surface of the active layer 221 having the groove 212 formed therein (FIG. 7C). Thereafter, the CMUT 201 is formed on the insulation layer 202 formed on the upper surface through a widely used process (FIG. 7D). Subsequently, the wafer is cut at substantially the center of the groove 212 by dicing and is separated into pieces (FIG. 7E). In this manner, the substrate 200 does not have a sharp corner and has the concave portion 210 having the surface covered by the insulation layer 202. The subsequent process to connect the flexible printed circuit board 203 is the same as that of the fifth exemplary embodiment.

By using the manufacturing method according to the present exemplary embodiment, the concave portion 210 having a highly accurate depth can be produced. Accordingly, since a capacitive transducer produced using the method of the present exemplary embodiment has an accurately controlled length of the side surface of the substrate 200 having the insulation layer 202 disposed thereon, the positional relationship between the substrate 200 and the coverlay can be accurately determined. As a result, a capacitive transducer having an increased reliability of electrical insulation property can be provided.

Eighth Exemplary Embodiment

An eighth exemplary embodiment is described below with reference to FIGS. 8 and 9. The eighth exemplary embodiment relates to an ultrasonic measurement apparatus using the capacitive transducer of any one of the first to seventh exemplary embodiments.

In FIG. 8, a capacitive transducer 401, an object to be measured 402, an image information generating unit 403, and an image display 404 are illustrated. In addition, in FIG. 8, the ultrasonic waves 501 and 502, ultrasonic transmission information 503, an ultrasonic reception signal 504, reproduced image information 505, and an ultrasonic measurement apparatus 400 are illustrated. The ultrasonic wave 501 output from the capacitive transducer 401 to the object to be measured 402 is reflected by the surface of the object to be measured 402 due to a difference between the characteristic acoustic impedances at the interface. The ultrasonic wave 502 that is reflected is received by the capacitive transducer 401, and the magnitude and shape of the received signal and the time information are sent to the image information generating unit 403 as the ultrasonic reception signal 504. In addition, the magnitude and shape of a transmission ultrasonic wave and the time information are sent from the capacitive transducer 401 to the image information generating unit 403 as the ultrasonic transmission information 503. The image information generating unit 403 generates an image signal of the object to be measured 402 on the basis of the ultrasonic reception signal 504 and the ultrasonic transmission information 503 and sends the generated image signal as the reproduced image information 505, which is displayed on the image display 404.

According to the present exemplary embodiment, the capacitive transducer 401 includes the CMUT according to any one of the above-described exemplary embodiments. The CMUT can reduce stick-out of an interconnection line connection portion toward the object to be measured 402, where the interconnection line connection portion connects the interconnection line connected to an external circuit to a CMUT chip. Accordingly, the acoustic lens can be disposed close to the surface of the CMUT and, thus, a capacitive transducer having negligibly deteriorated transmission and reception performance can be provided. The capacitive transducer 401 according to the present exemplary embodiment has negligibly deteriorated transmission and reception performance and, thus, can receive a highly accurate information about the ultrasonic wave 502 that is reflected by the object to be measured 402. As a result, the image of the object to be measured 402 can be accurately reproduced.

According to the ultrasonic measurement apparatus of the present exemplary embodiment, since a capacitive transducer having excellent transmission and reception performance is used, a compact ultrasonic measurement apparatus that can obtain an excellent image can be provided.

Figure 9:
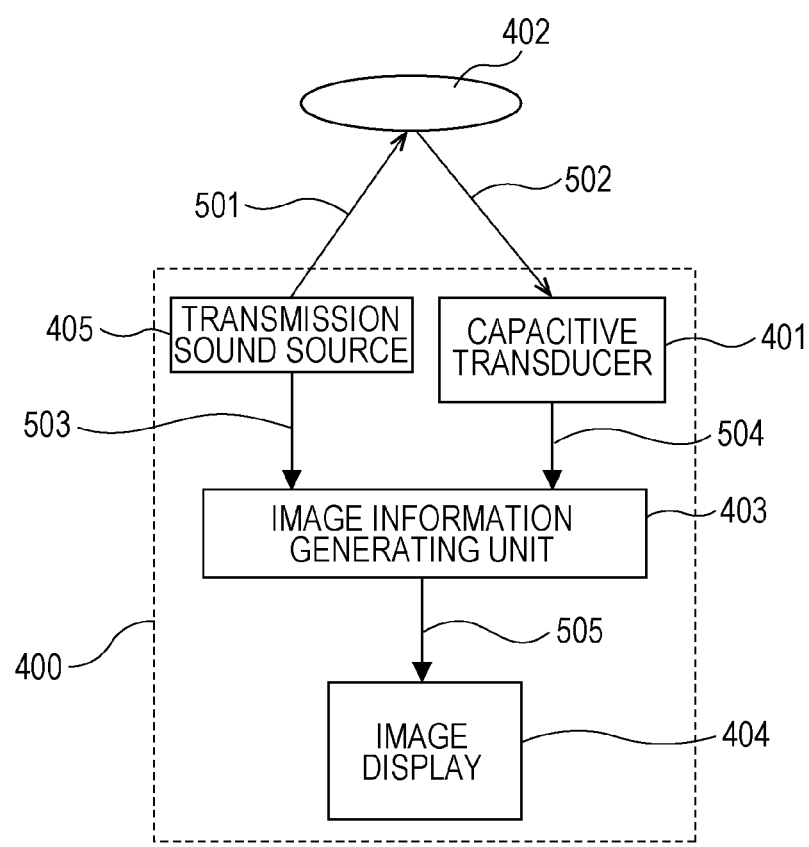
FIG. 9 illustrates an ultrasonic measurement apparatus according to the eighth exemplary embodiment.

In addition, as another form of the present exemplary embodiment, a different transmission sound source 405 can be provided, as illustrated in FIG. 9. Thus, the ultrasonic wave generated by the transmission sound source 405 can be highly accurately detected by the capacitive transducer 401. Alternatively, the capacitive transducer 401 may receive an ultrasonic wave generated by a photo-acoustic effect after a light beam (an electromagnetic wave) is emitted from the light source to the object to be measured 402. As described above, the capacitive transducer 401 can be used as a receiving element regardless of the type of transmission sound source.

Ninth Exemplary Embodiment

In addition to receiving and transmitting an elastic wave, such as an ultrasonic wave or an acoustic wave, the capacitive transducers of the above-described exemplary embodiments can be used to detect an external force. A ninth exemplary embodiment relates to a sensor (a measurement apparatus) using the capacitive transducer according to any one of the first to seventh exemplary embodiments. The ninth exemplary embodiment is described below with reference to FIG. 10.

Figure 10:
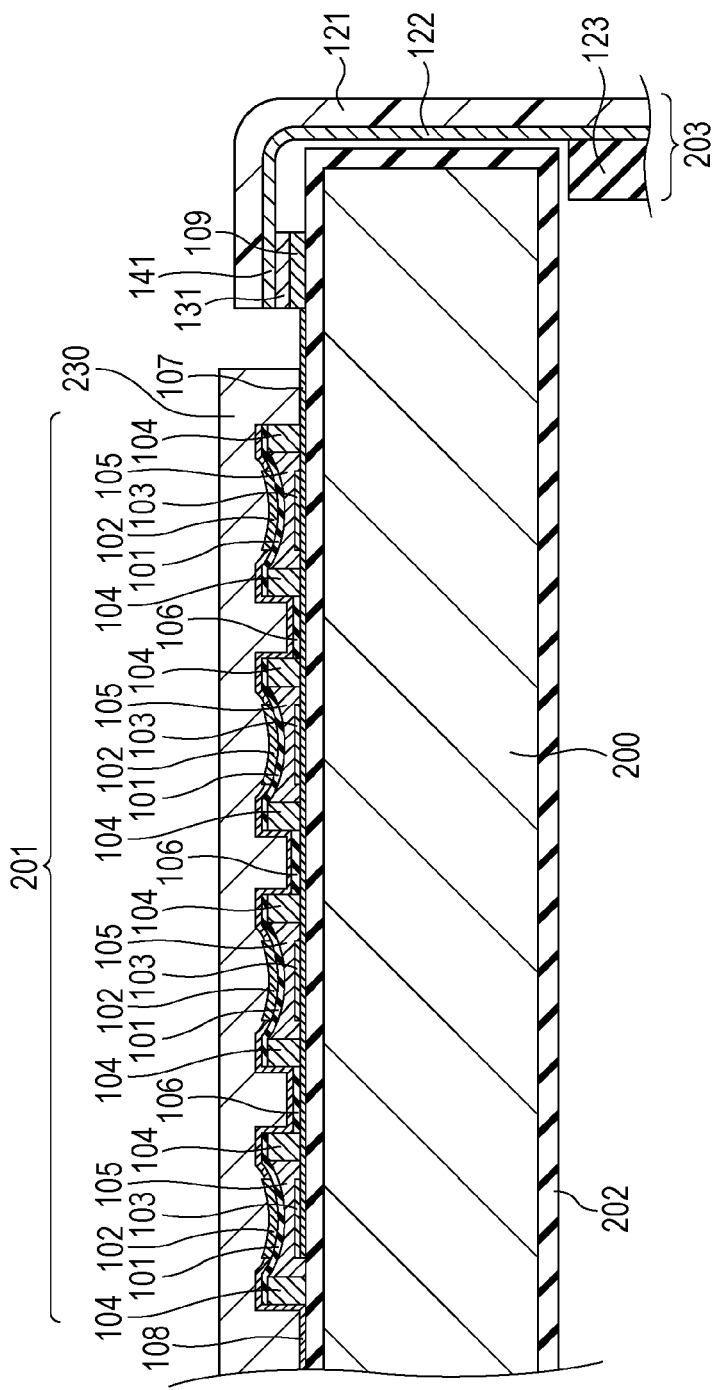
FIG. 10 illustrates a sensor (a measurement apparatus) according to a ninth exemplary embodiment.
Figure 11:
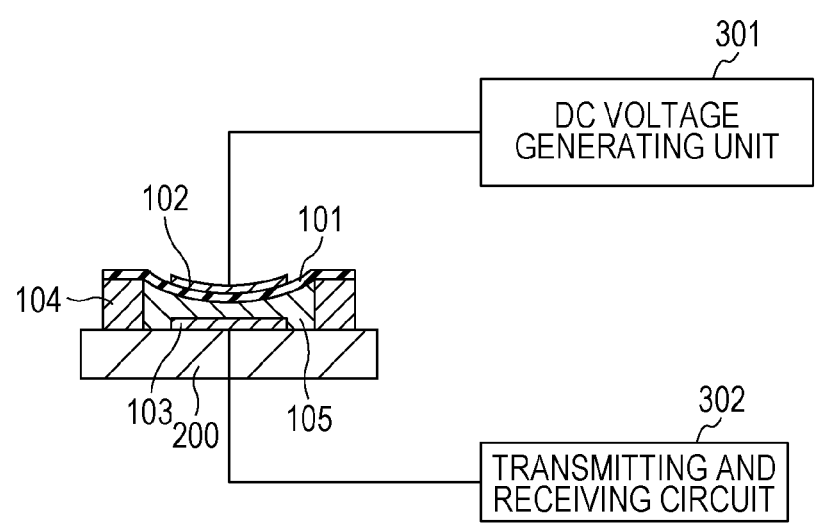
FIG. 11 illustrates an existing capacitive transducer.
Figure 12A:
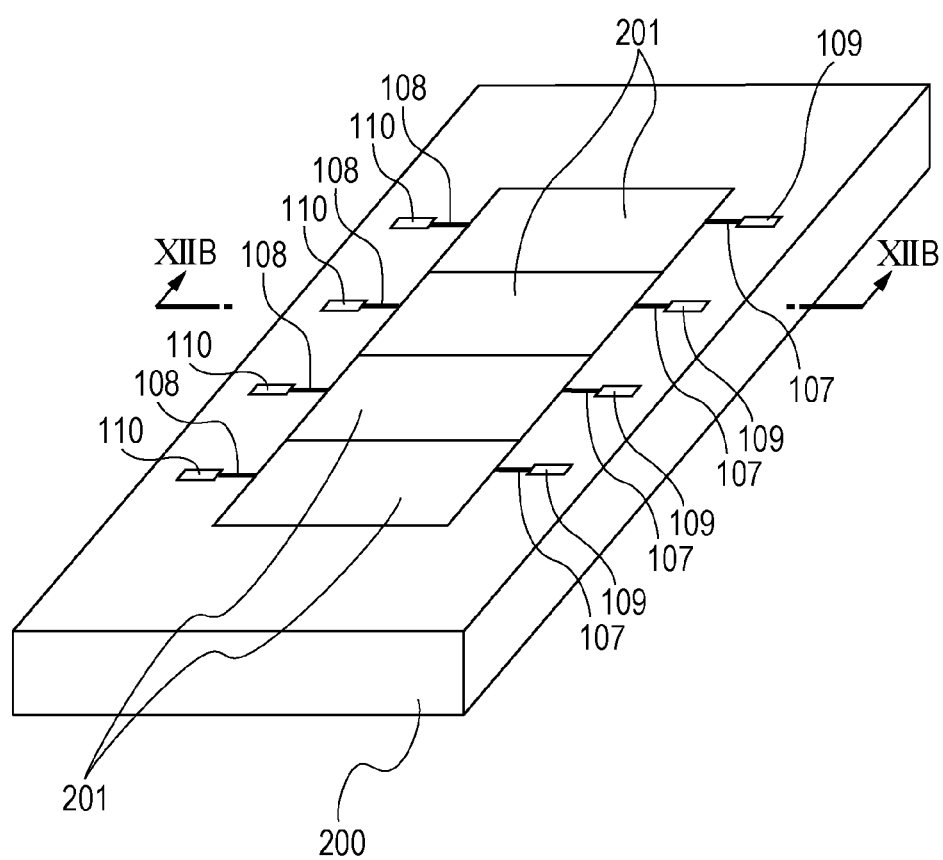
FIGS. 12A and 12B illustrate an issue regarding the transducer.
Figure 12B:
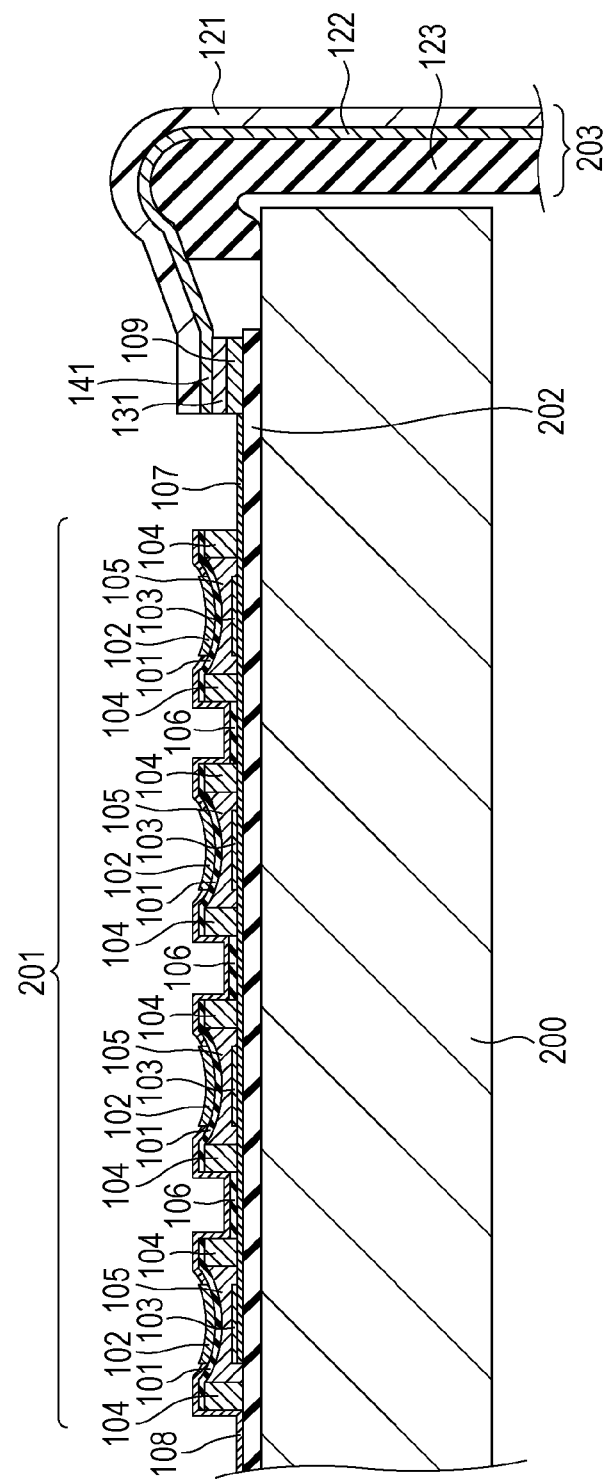

FIG. 10 is a schematic illustration of a capacitive transducer according to the present exemplary embodiment. The surface of a CMUT has the protection film 230 formed thereon, and an external force applied from the outside to the surface of the CMUT is transferred to a vibrating membrane. A DC and AC voltage generating unit is connected to the first electrode 102 serving as part of the vibrating membrane. A predetermined DC voltage Va and an AC voltage Vsin having a predetermined frequency are applied to the first electrode 102 by the DC and AC voltage generating unit. In contrast, the second electrode 103 is connected to a detection circuit and has a fixed potential that is close to the GND potential. By using the DC voltage Va, a potential difference Vbias (=Va−0 V) is generated between the first electrode 102 and the second electrode 103. By controlling the value of Va, the value of Vbias can be set so as to be the same as a desired potential difference determined on the basis of the mechanical property of the cell of the CMUT (a value between several tens volt and several hundred volt).

When no external force is input to the vibrating membrane 101, a small electric current determined by the AC voltage Vsin and the distance between the electrodes is generated in the second electrode 103. The value of the electric current can be converted into a voltage by the detection circuit, and the voltage can be output to the outside. At that time, the vibrating membrane 101 receives an external force via the protection film 230. Thus, the vibrating film 101 deforms. Consequently, the distance between the electrodes changes, and the value of the small electrical current generated in the second electrode 103 varies. The detection circuit converts the current value to a voltage and outputs the voltage to the outside. By comparing the voltage with a voltage output when no external force is input to the vibrating membrane 101, the external force can be detected.

According to the present exemplary embodiment, the capacitive transducer includes the CMUT according to any one of the above-described exemplary embodiments. The CMUT can reduce stick-out of an interconnection line connection portion toward an object to be measured, where the interconnection line connection portion connects the interconnection line connected to an external circuit to a CMUT chip. Accordingly, a thin and uniform protection film can be disposed on the upper surface of the CMUT. Thus, a capacitive transducer having high sensitivity to an external force can be provided. By using the capacitive transducer according to the present exemplary embodiment, a sensor having high sensitivity to an external force can be provided.

Tenth Exemplary Embodiment

Unlike the above-described exemplary embodiments, according to a tenth exemplary embodiment, a different insulation material is disposed between the substrate 200 and the conductive foil 122 of the flexible print circuit board 203. The other elements are the same as those of any one of the first to ninth exemplary embodiments. Hereinafter, although descriptions are made with reference to FIGS. 13A to 13D which are based on the first exemplary embodiment, the descriptions can apply to the other exemplary embodiments.

Figure 13A:
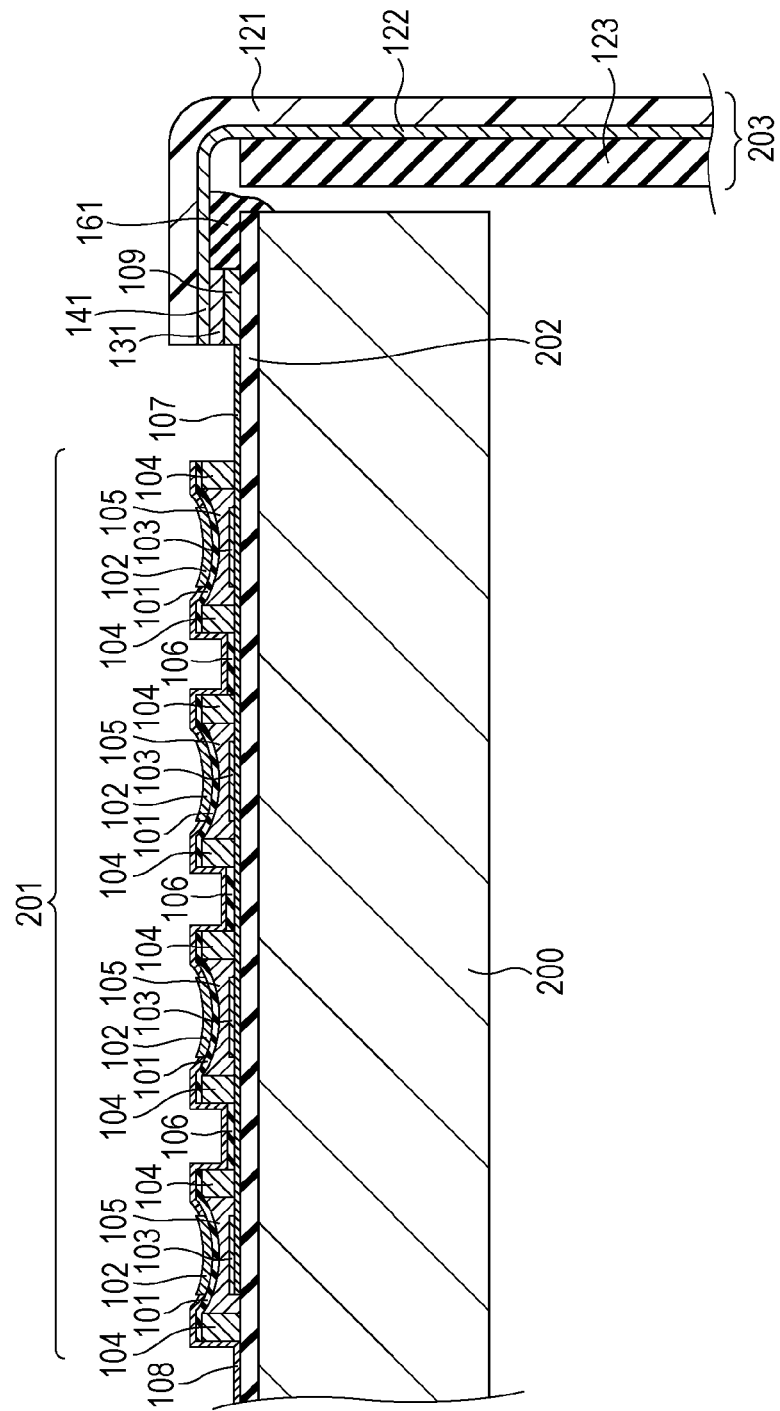

FIG. 13A is a cross-sectional view of a capacitive transducer including an electric connecting portion 131 formed from an anisotropically conductive film (ACF). The electric connecting portion 131 is disposed between the connection electrode 109 on the substrate 200 and the connection electrode 141 on the flexible print circuit board 203.

During a manufacturing process, the anisotropically conductive film is disposed between the connection electrode 109 on the substrate 200 and the connection electrode 141 on the flexible print circuit board 203. The anisotropically conductive film is formed of an insulating heat curable resin containing a fine conductive metal particles. By applying a clamping pressure by the electrodes that face each other and reducing the distance between the electrodes to a value less than or equal to the size of the conductive metal particle, the electrodes can be electrically connected to each other and, thus, the function of the electric connecting portion 131 can be achieved. In contrast, in a region of the anisotropically conductive film that is not clamped by the electrodes, since the conductive metal particles are dispersed in the insulating material, electric insulation is maintained. The anisotropically conductive film is produced by heating. Accordingly, during heating, the fluidity of the anisotropically conductive film increases and, thus, the anisotropically conductive film flows into an area where the electrode is not disposed. After cooling, the anisotropically conductive film is cured. In this manner, an anisotropically conductive film 161 having an insulation property is disposed on the surface of the conductive foil 122 disposed on the flexible print circuit board 203.

According to the present exemplary embodiment, since the anisotropically conductive film 161 having an insulation property is disposed on the surface of the conductive foil 122 disposed on the flexible print circuit board 203, electrical insulation between the side surface of the substrate 200 and the conductive foil 122 disposed on the flexible print circuit board 203 can be improved and reliably ensured. That is, the reliability of the electrical insulation can be increased. In FIG. 13A, the anisotropically conductive film 161 having an insulation property is disposed on the entire exposed surface of the conductive foil 122. However, the anisotropically conductive film 161 need not be disposed on the entire exposed surface. Even when the anisotropically conductive film 161 is disposed on part of the surface, the reliability of electrical insulation can be increased in the same manner.

Another form of the present exemplary embodiment is described below with reference to FIG. 13B. As illustrated in FIG. 13B, this form is characterized in that a different insulating member 171 is disposed between the substrate 200 and the conductive foil 122 disposed on the flexible print circuit board 203. The different insulating member 171 can be easily formed by filling a region between the substrate 200 and the conductive foil 122 with silicone rubber. By using silicone rubber, the apace between the substrate 200 and the flexible print circuit board 203 can be more reliably filled than in the configuration illustrated in FIG. 13A. Thus, electrical insulation between the side surface of the substrate 200 and the conductive foil 122 disposed on the flexible print circuit board 203 can be improved and reliably maintained.

Alternatively, the different insulating member 171 can be achieved by using a potting material which is used for electrical insulation of electric components. The different insulating member 171 can be made of, for example, urethane, epoxy, or butyl rubber. Since a potting material which is used for electrical insulation of electric components has a permeability of water vapor lower than silicone rubber, a high insulation property can be ensured even in a high humidity environment.

Figure 13C:
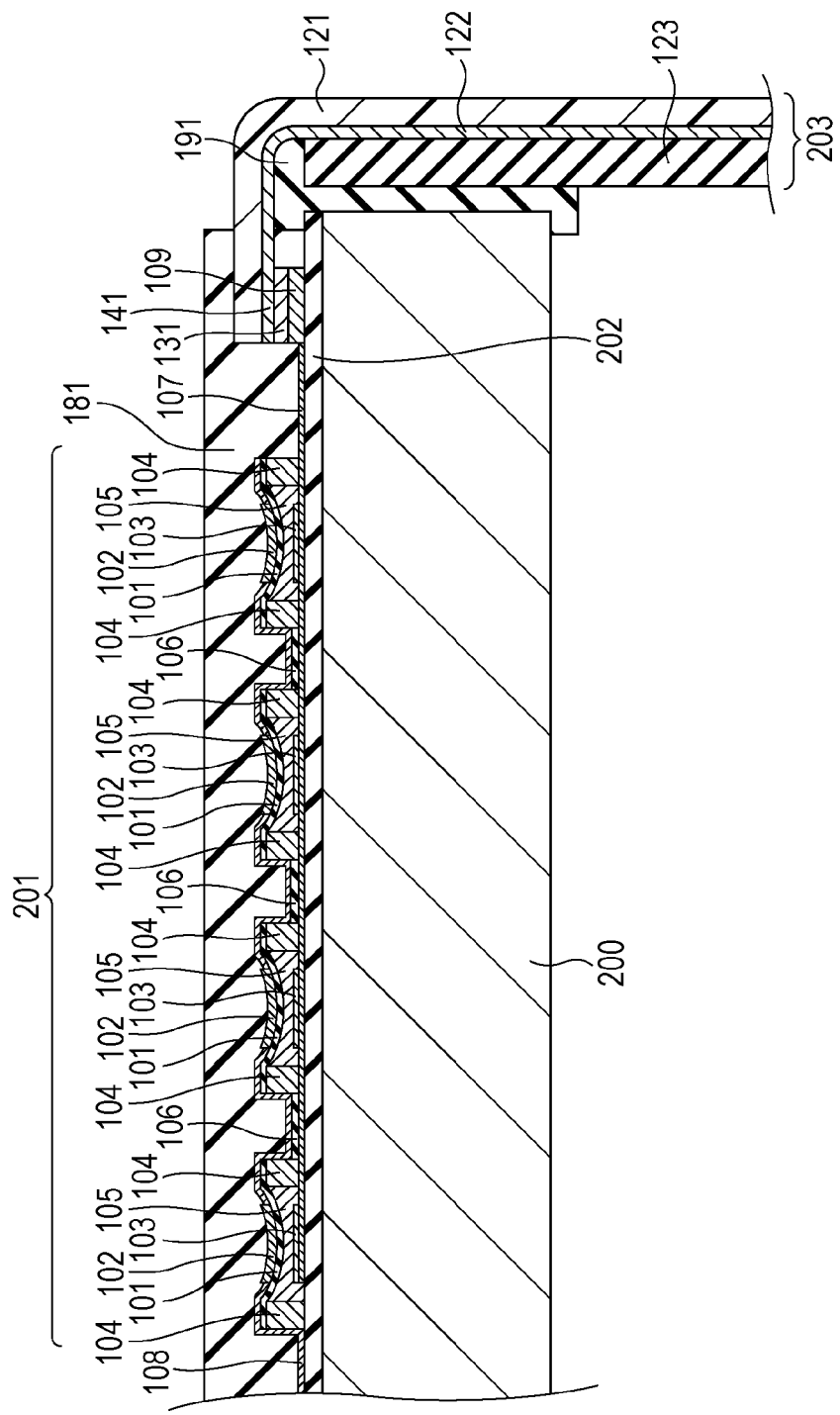

In addition, as illustrated in FIG. 13C, a different insulating member can be formed from a plurality of insulation layers including an insulation layer of the silicone rubber 181 and an insulation layer of the potting material 191. An insulation layer of the silicone rubber 181 is disposed in a region in proximity to the CMUT, and an insulation layer of the potting material 191 id disposed in the vicinity of the side surface of the substrate 200. Since the silicone rubber 181 can be used for the protecting layer for protecting the surface of the CMUT, the silicone rubber 181 can serve as the protecting layer and the insulation layer of the CMUT. In addition, since the silicone rubber 181 is disposed on the CMUT and in the vicinity of the CMUT, the potting material 191 does not flow around the CMUT during manufacture and does not deteriorate the performance of the CMUT. As described above, the configuration illustrated in FIG. 13C does not adversely affect the performance of the CMUT and can ensure high insulation property.

Figure 13D:
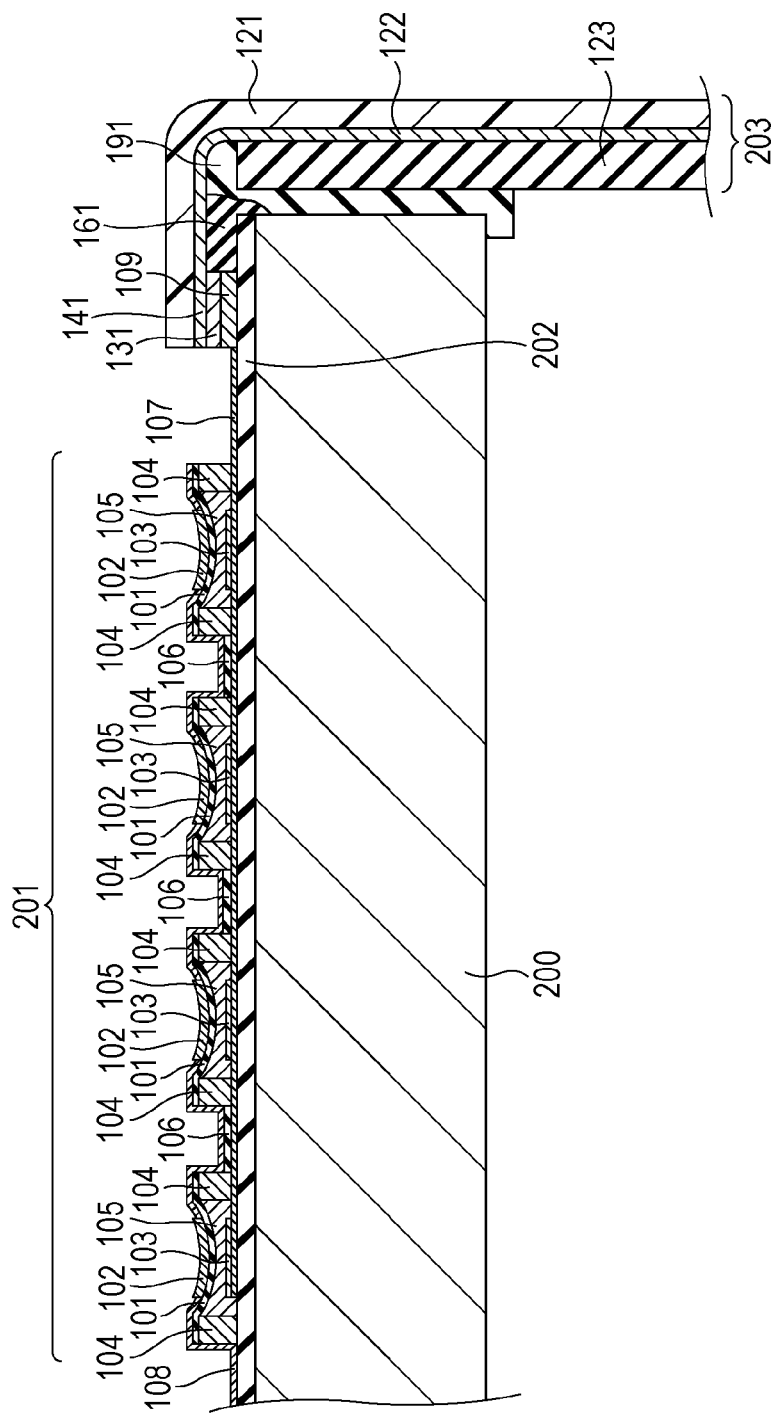

Alternatively, as illustrated in FIG. 13D, a configuration generated by combining the forms of FIGS. 13A and 13B can be employed. Although not illustrated, a configuration generated by combining the forms of FIGS. 13D and 13C may be employed. In this manner, an increased insulation property can be ensured.

While the above-described exemplary embodiments have been described with reference to the region between the substrate 200 and the flexible print circuit board 203 completely filled with a different insulating member 171, the silicone rubber 181, or the potting material 191, the configuration of the present invention is not limited thereto. A configuration in which the insulating member is disposed in only part of the region can be employed in the same manner if any problem of electrical insulation does not occur in a practical use.

According to the present invention, the interconnection line of the transducer can be connected to, for example, an external circuit while preventing protrusion of a flexible printed circuit board and maintaining electrical insulation at a desired portion of the transducer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-121568 filed Jun. 12, 2014, which is hereby incorporated by reference herein in its entirety.

What is claimed is:

1. A transducer comprising:
   a substrate;
   a cell including a vibrating membrane and a second electrode, the vibrating membrane including a first electrode, the second electrode being disposed on the substrate with a spacing from the first electrode;
   a connection electrode disposed on a surface of the substrate having the cell disposed thereon, the connection electrode being electrically connected to one of the first and second electrodes; and
   a flexible print circuit board including an insulating film and a conductive portion disposed on the insulating film, the conductive portion being electrically connected to the connection electrode,
   wherein part of the conductive portion is exposed to face an upper surface of the substrate having the cell disposed thereon, and
   wherein an insulation layer is disposed on part of the upper surface of the substrate facing the flexible print circuit board.

2. The transducer according to claim 1,
   wherein the flexible print circuit board is disposed to extend and bend at an end portion of the substrate extending from the upper surface to a side surface of the substrate.

3. The transducer according to claim 2,
   wherein the conductive portion is exposed on the bent portion of the flexible print circuit board to face the end portion of the substrate.

4. The transducer according to claim 2,
   wherein the insulation layer is further disposed on the side surface of the substrate that faces the flexible print circuit board.

5. The transducer according to claim 2, further comprising:
   a support member configured to support the substrate,
   wherein the insulation layer is further disposed on part of the side surface of the substrate that faces the flexible print circuit board and part of a side surface of the support member that faces the flexible print circuit board.

6. The transducer according to claim 2,
   wherein the end portion of the substrate has a concave portion, and
   wherein the insulation layer is disposed on a surface of the concave portion.

7. The transducer according to claim 2,
   wherein the substrate has a structure in which a BOX layer is sandwiched by a handle layer and an active layer,
   wherein the insulation layer covers an upper surface and a side surface of the active layer, and
   wherein the cell is disposed on the active layer via the insulation layer.

8. The transducer according to claim 7,
   wherein a potential of the active layer equals a potential of the second electrode.

9. The transducer according to claim 7,
   wherein the active layer functions as the second electrode.

10. The transducer according to claim 1,
    wherein the second electrode is disposed on the substrate via the insulation layer.

11. The transducer according to claim 2,
    wherein the conductive portion of the flexible print circuit board is exposed to face at least part of the side surface.

12. The transducer according to claim 6,
    wherein the conductive portion of the flexible print circuit board is exposed to face at least part of the surface of the concave portion.

13. The transducer according to claim 1,
wherein at least one of anisotropy conductive resin, silicone rubber, urethane resin, epoxy resin, and butylene rubber is disposed between the cell and the flexible print circuit board.

14. A transducer comprising:
a substrate;
an element disposed on the substrate, the element including an electrode;
a connection electrode disposed on a surface of the substrate having the element disposed thereon, the connection electrode being electrically connected to the electrode; and
a flexible print circuit board including an insulating film and a conductive portion disposed on the insulating film, the conductive portion being electrically connected to the connection electrode,
wherein part of the conductive portion is exposed so as to face an upper surface of the substrate having the element disposed thereon, and
wherein an insulation layer is disposed on part of the upper surface of the substrate facing the flexible print circuit board.

15. A method for manufacturing a transducer including an element disposed on a substrate and that includes an electrode, comprising:
forming a groove in a semiconductor wafer serving as the substrate;
forming an insulation layer on a surface of the semiconductor wafer having the groove formed therein;
providing the element on the insulation layer; and
cutting the substrate at a position of the groove by dicing.

16. The method according to claim 15, further comprising:
electrically connecting a conductive portion of a flexible print circuit board exposed to a connection electrode electrically connected to the electrode disposed on the insulation layer using an electric connecting portion; and
bending and disposing the flexible print circuit board to be perpendicular to an upper surface of the semiconductor wafer.

17. A measurement apparatus comprising:
the transducer according to claim 1, the transducer receiving an external force,
wherein the measurement apparatus measures a magnitude of the external force applied to a surface of the transducer using a signal output from the transducer.

18. A measurement apparatus comprising:
the transducer according to claim 1, the transducer receiving an elastic wave from an object to be measured; and
an image information generating unit configured to generate image information regarding the object to be measured using at least a signal received from the transducer.

* * * * *